United States Patent
Tandon et al.

(10) Patent No.: US 11,107,658 B2
(45) Date of Patent: Aug. 31, 2021

(54) FILL PATTERN TO ENHANCE E-BEAM PROCESS MARGIN

(71) Applicant: Intel Corporation, Santa Clara, CA (US)

(72) Inventors: Shakul Tandon, Hillsboro, OR (US); Mark C. Phillips, Portland, OR (US); Shem O. Ogadhoh, Beaverton, OR (US); John A. Swanson, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 16/323,128

(22) PCT Filed: Sep. 30, 2016

(86) PCT No.: PCT/US2016/054802
§ 371 (c)(1),
(2) Date: Feb. 4, 2019

(87) PCT Pub. No.: WO2018/063331
PCT Pub. Date: Apr. 5, 2018

(65) Prior Publication Data
US 2019/0164723 A1    May 30, 2019

(51) Int. Cl.
*H01J 37/317*    (2006.01)
*H01L 21/033*    (2006.01)
(Continued)

(52) U.S. Cl.
CPC ........ *H01J 37/3007* (2013.01); *H01J 37/045* (2013.01); *H01J 37/3177* (2013.01);
(Continued)

(58) Field of Classification Search
CPC ... H01J 37/3007; H01J 37/045; H01J 37/3177
(Continued)

(56) References Cited

U.S. PATENT DOCUMENTS

| 2007/0082277 A1 | 4/2007 | Matthew et al. |
| 2011/0018146 A1 | 1/2011 | Pierrat |
| 2016/0099129 A1* | 4/2016 | Yamashita ............ H01J 37/045 |
| | | 250/396 R |

FOREIGN PATENT DOCUMENTS

| WO | WO-2015191104 | 12/2015 |
| WO | WO-2016028334 | 2/2016 |

OTHER PUBLICATIONS

International Preliminary Report on Patentability for International Patent Application No. PCT/US2016/054742, dated Apr. 11, 2019, 7 pgs.

(Continued)

*Primary Examiner* — Elias Ullah
(74) *Attorney, Agent, or Firm* — Schwabe, Williamson & Wyatt, P.C.

(57) ABSTRACT

Lithographic apparatuses suitable for complementary e-beam lithography (CEBL) are described. In an example, a method of forming a pattern for a semiconductor structure includes forming a pattern of parallel lines above a substrate. The method also includes aligning the substrate in an e-beam tool to provide the pattern of parallel lines parallel with a scan direction of the e-beam tool. The e-beam tool includes a column having a blanker aperture array (BAA) with a staggered pair of columns of openings along an array direction orthogonal to the scan direction. The method also includes forming a pattern of cuts or vias in or above the pattern of parallel lines to provide line breaks for the pattern of parallel lines by scanning the substrate along the scan direction. A cumulative current through the column has a non-zero and substantially uniform cumulative current value throughout the scanning.

20 Claims, 27 Drawing Sheets

(51) Int. Cl.
    *H01J 37/30*          (2006.01)
    *H01L 21/027*        (2006.01)
    *H01J 37/04*          (2006.01)

(52) U.S. Cl.
    CPC ........ *H01L 21/027* (2013.01); *H01L 21/0338* (2013.01); *H01J 2237/0435* (2013.01); *H01J 2237/0437* (2013.01); *H01J 2237/1538* (2013.01); *H01J 2237/20228* (2013.01); *H01J 2237/3175* (2013.01)

(58) Field of Classification Search
    USPC ........................................................ 438/795
    See application file for complete search history.

(56) References Cited

OTHER PUBLICATIONS

International Search Report and Written Opinion for International Patent Application No. PCT/US2016/054802 dated Jun. 30, 2017, 15 pgs.

\* cited by examiner

PLAN VIEW 2400

CROSS-SECTIONAL VIEWS

FILL PATTERN TO ENHANCE E-BEAM PROCESS MARGIN

CROSS-REFERENCE TO RELATED APPLICATION

This patent application is a U.S. National Phase Application under 35 U.S.C. § 371 of International Application No. PCT/US2016/054802, filed Sep. 30, 2016, entitled "FILL PATTERN TO ENHANCE EBEAM PROCESS MARGIN," which designates the United States of America, the entire disclosure of which is hereby incorporated by reference in its entirety and for all purposes.

TECHNICAL FIELD

Embodiments of the invention are in the field of lithography and, in particular, lithography involving complementary e-beam lithography (CEBL).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

However, improvements are needed in the area of lithographic processing technologies and capabilities.

DESCRIPTION OF THE EMBODIMENTS

Figure 1A:
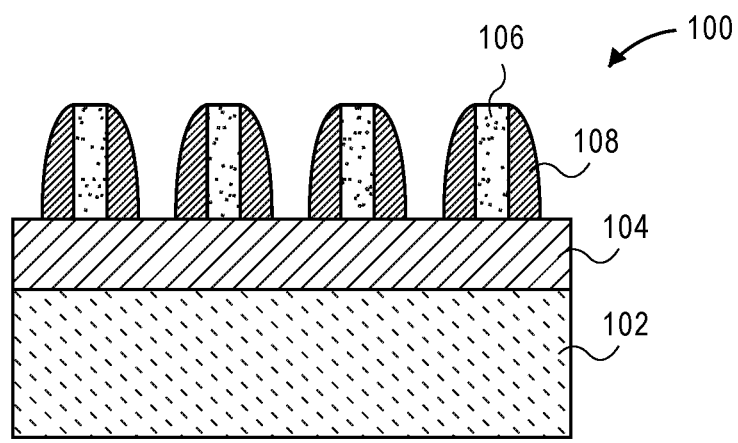
FIG. 1A illustrates a cross-sectional view of a starting structure following deposition, but prior to patterning, of a hardmask material layer formed on an interlayer dielectric (ILD) layer.

Lithographic apparatuses suitable for, and methodologies involving, complementary e-beam lithography (CEBL) are described. In the following description, numerous specific details are set forth, such as specific tooling, integration and material regimes, in order to provide a thorough understanding of embodiments of the present invention. It will be apparent to one skilled in the art that embodiments of the present invention may be practiced without these specific details. In other instances, well-known features, such as single or dual damascene processing, are not described in detail in order to not unnecessarily obscure embodiments of the present invention. Furthermore, it is to be understood that the various embodiments shown in the Figures are illustrative representations and are not necessarily drawn to scale. In some cases, various operations will be described as multiple discrete operations, in turn, in a manner that is most helpful in understanding the present invention, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Integrated circuits commonly include electrically conductive microelectronic structures, which are known in the art as vias. Vias can be used to electrically connect metal lines above the vias to metal lines below the vias. Vias are typically formed by a lithographic process. Representatively, a photoresist layer may be spin coated above a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. When patterning extremely small vias with extremely small pitches by such lithographic processes, several challenges present themselves.

One such challenge is that the overlay between the vias and the overlying metal lines, and the overlay between the vias and the underlying metal lines, generally needs to be controlled to high tolerances on the order of a quarter of the via pitch. As via pitches scale ever smaller over time, the overlay tolerances tend to scale with them at an even greater rate than lithographic equipment is able to scale with.

Another such challenge is that the critical dimensions of the via openings generally tend to scale faster than the resolution capabilities of lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may have to be used, which tends to increase the fabrication costs. At some point, if pitches continue to decrease, it may not be possible, even with multiple masks, to print via openings for these extremely small pitches using conventional scanners. In the same vein, the fabrication of cuts (i.e., disruptions) in the metal line structures associated with metal vias is faced with similar scaling issues.

One or more embodiments described herein are directed to lithographic approaches and tooling involving or suitable for complementary e-beam lithography (CEBL), including semiconductor processing considerations when implementing such approaches and tooling.

Complementary lithography draws on the strengths of two lithography technologies, working hand-in-hand, to lower the cost of patterning critical layers in logic devices at 20 nm half-pitch and below, in high-volume manufacturing (HVM). The most cost-effective way to implement complementary lithography is to combine optical lithography with e-beam lithography (EBL). The process of transferring integrated circuit (IC) designs to the wafer entails the following: optical lithography to print unidirectional lines (either strictly unidirectional or predominantly unidirectional) in a pre-defined pitch, pitch division techniques to increase line density, and EBL to "cut" the lines. EBL is also used to pattern other critical layers, notably contact and via holes. Optical lithography can be used alone to pattern other layers. When used to complement optical lithography, EBL is referred to as CEBL, or complementary EBL. CEBL is directed to cutting lines and holes. By not attempting to pattern all layers, CEBL plays a complementary but crucial role in meeting the industry's patterning needs at advanced (smaller) technology nodes (e.g., 10 nm or smaller such as 7 nm or 5 nm technology nodes). CEBL also extends the use of current optical lithography technology, tools and infrastructure.

Figure 1B:
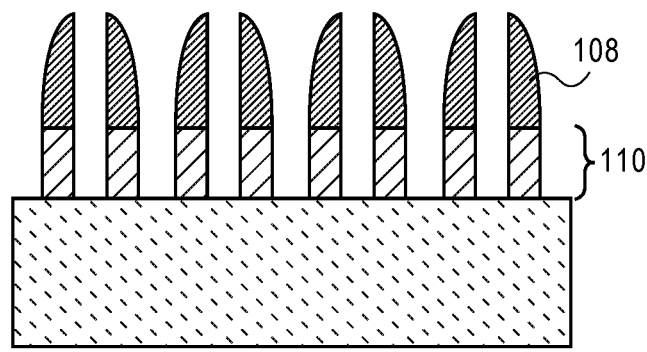
FIG. 1B illustrates a cross-sectional view of the structure of FIG. 1A following patterning of the hardmask layer by pitch halving.

As mentioned above, pitch division techniques can be used to increase a line density prior to using EBL to cut such lines. In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, as a first portion of a CEBL integration scheme, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

Figure 2:
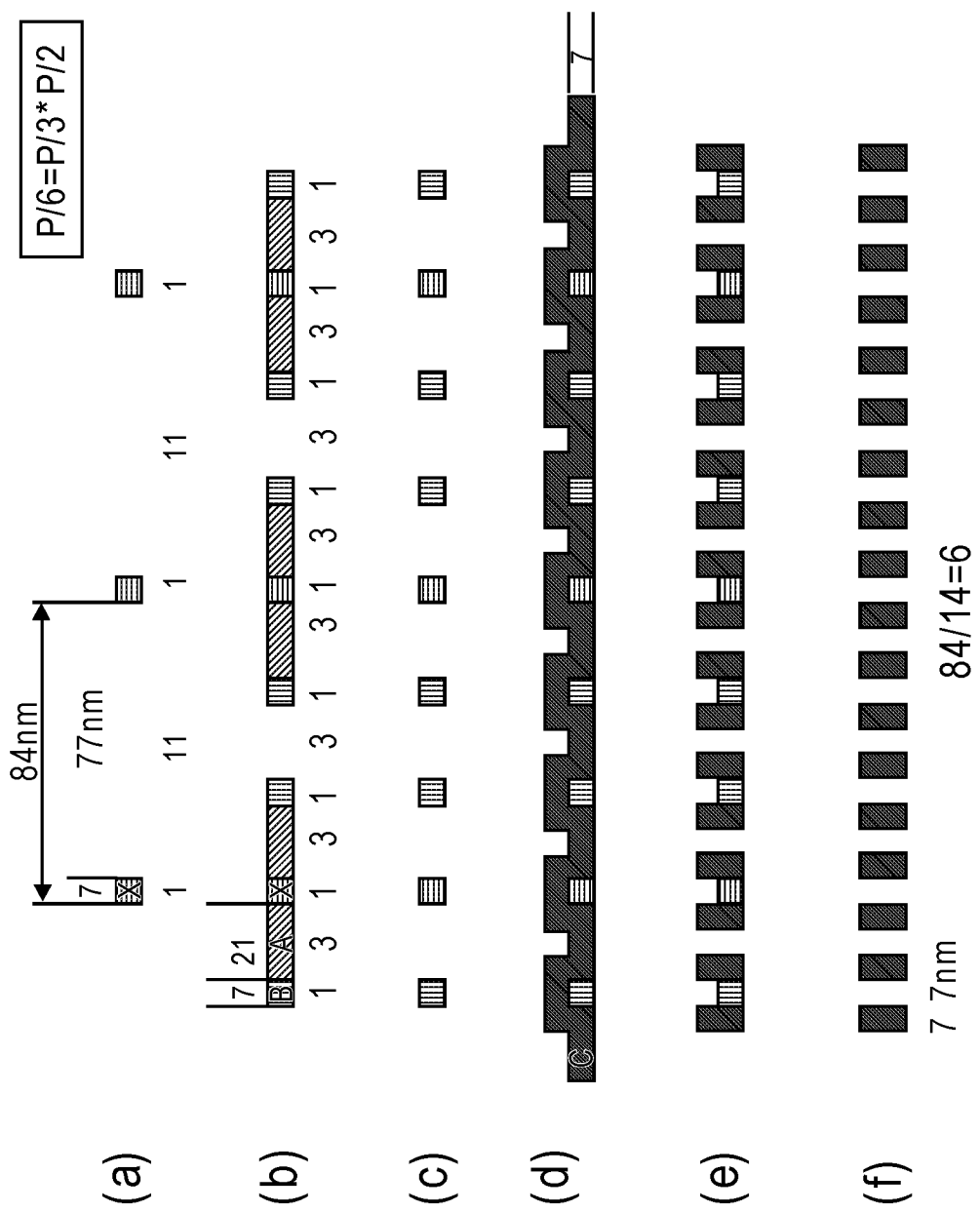
FIG. 2 illustrates cross-sectional views in a spacer-based-sextuple-patterning (SBSP) processing scheme which involves pitch division by a factor of six.

For example, FIG. 2 illustrates cross-sectional views in a spacer-based-sextuple-patterning (SBSP) processing scheme which involves pitch division by a factor of six. Referring to FIG. 2, at operation (a), a sacrificial pattern X is shown following lithography and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

Figure 3:
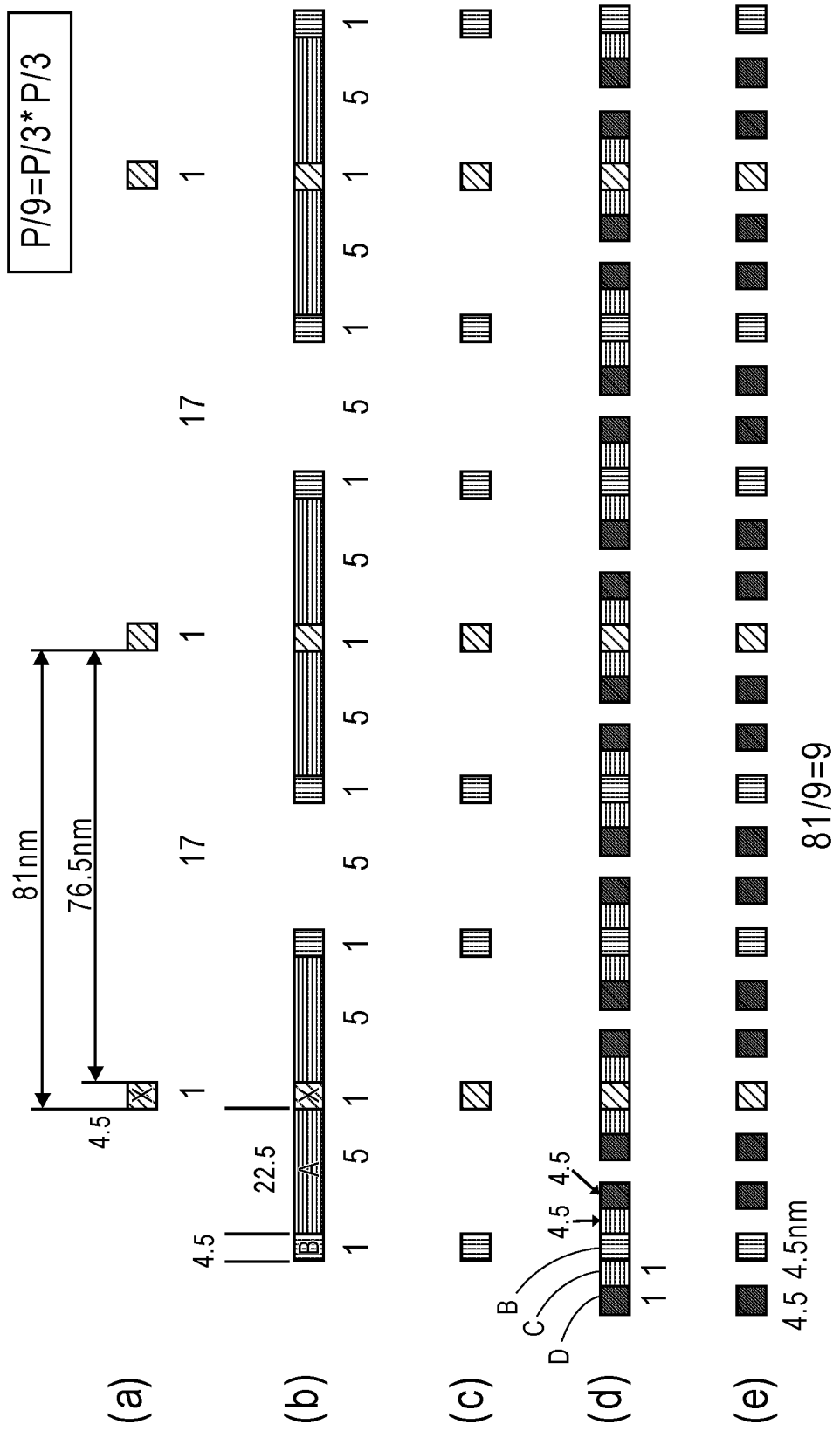
FIG. 3 illustrates cross-sectional views in a spacer-based-nonuple-patterning (SBNP) processing scheme which involves pitch division by a factor of nine.

In another example, FIG. 3 illustrates cross-sectional views in a spacer-based-nonuple-patterning (SBNP) processing scheme which involves pitch division by a factor of nine. Referring to FIG. 3, at operation (a), a sacrificial pattern X is shown following lithography and etch processing. At operation (b), spacers A and B are shown following deposition and etching. At operation (c), the pattern of operation (b) is shown following spacer A removal. At operation (d), the pattern of operation (c) is shown following spacer C and D deposition and etch. At operation (e), a pitch/9 pattern is achieved following spacer C removal.

In any case, in an embodiment, complementary lithography as described herein involves first fabricating a gridded layout by conventional or state-of the-art lithography, such as 193 nm immersion lithography (193i). Pitch division may be implemented to increase the density of lines in the gridded layout by a factor of n. Gridded layout formation with 193i lithography plus pitch division by a factor of n can be designated as 193i+P/n Pitch Division. Patterning of the pitch divided gridded layout may then be patterned using electron beam direct write (EBDW) "cuts," as is described in greater detail below. In one such embodiment, 193 nm immersion scaling can be extended for many generations with cost effective pitch division. Complementary EBL is used to break gratings continuity and to pattern vias.

More specifically, embodiments described herein are directed to patterning features during the fabrication of an integrated circuit. In one embodiment, CEBL is used to pattern openings for forming vias. Vias are metal structures used to electrically connect metal lines above the vias to metal lines below the vias. In another embodiment, CEBL is used to form non-conductive spaces or interruptions along the metal lines. Conventionally, such interruptions have been referred to as "cuts" since the process involved removal or cutting away of portions of the metal lines. However, in a damascene approach, the interruptions may be referred to as "plugs" which are regions along a metal line trajectory that are actually not metal at any stage of the fabrication scheme, but are rather preserved regions where metal cannot be formed. In either case, however, use of the terms cuts or plugs may be done so interchangeably. Via opening and metal line cut or plug formation is commonly referred to as back end of line (BEOL) processing for an integrated circuit. In another embodiment, CEBL is used for front end of line (FEOL) processing. For example, the scaling of active region dimensions (such as fin dimensions) and/or associated gate structures can be performed using CEBL techniques as described herein.

As described above, electron beam (ebeam) lithography may be implemented to complement standard lithographic techniques in order to achieved desired scaling of features for integrated circuit fabrication. An electron beam lithography tool may be used to perform the ebeam lithography. In an exemplary embodiment, FIG. 4 is a cross-sectional schematic representation of an ebeam column of an electron beam lithography apparatus.

Figure 4:
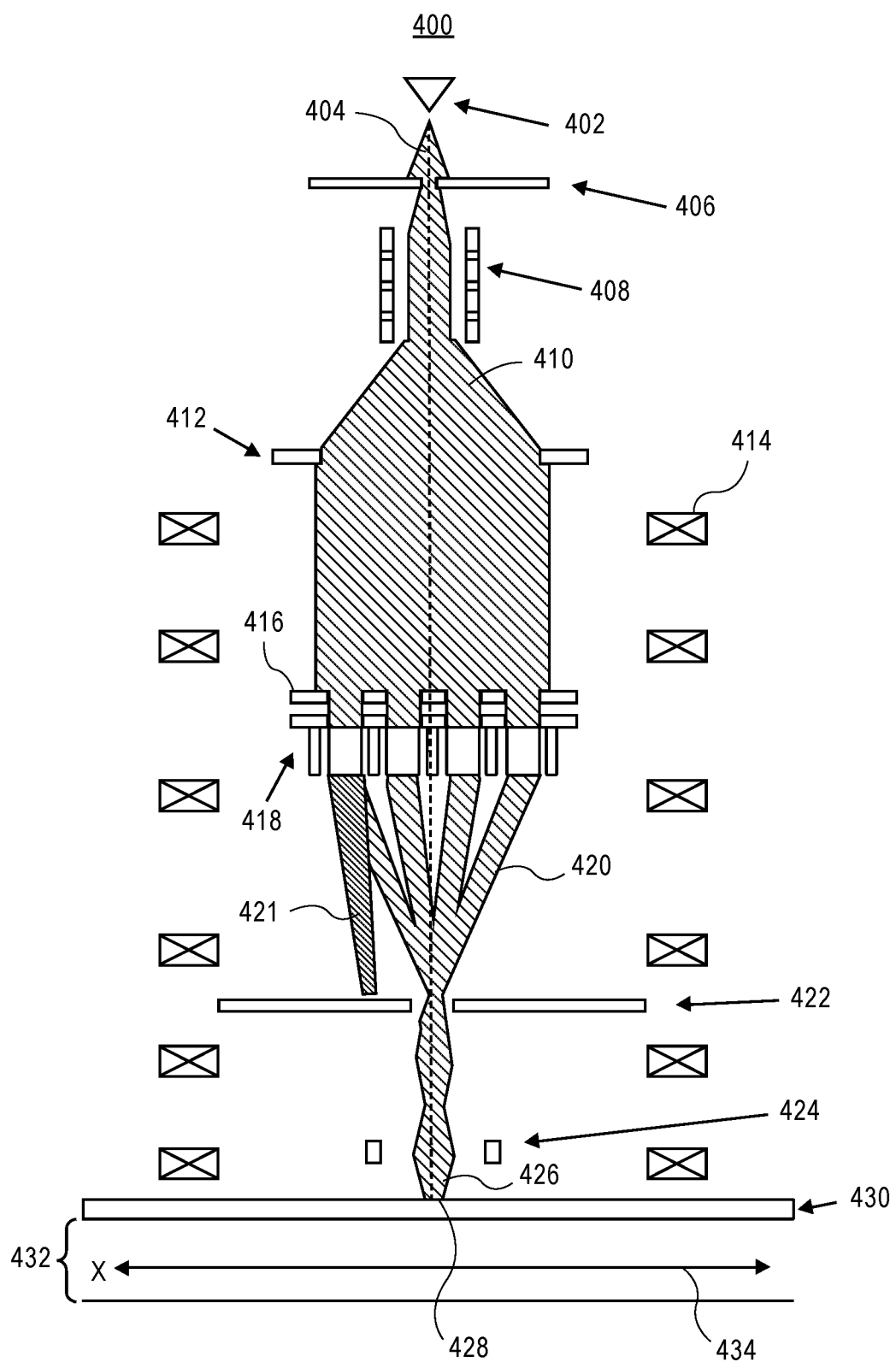
FIG. 4 is a cross-sectional schematic representation of an ebeam column of an electron beam lithography apparatus.

Referring to FIG. 4, an ebeam column 400 includes an electron source 402 for providing a beam of electrons 404. The beam of electrons 404 is passed through a limiting aperture 406 and, subsequently, through high aspect ratio illumination optics 408. The outgoing beam 410 is then passed through a slit 412 and may be controlled by a slim lens 414, e.g., which may be magnetic. Ultimately, the beam 404 is passed through a shaping aperture 416 (which may be a one-dimensional (1-D) shaping aperture) and then through a blanker aperture array (BAA) 418. The BAA 418 includes a plurality of physical apertures therein, such as openings formed in a thin slice of silicon. It may be the case that only a portion of the BAA 418 is exposed to the ebeam at a given time. Alternatively, or in conjunction, only a portion 420 of the ebeam 404 that passes through the BAA 418 is allowed to pass through a final aperture 422 (e.g., beam portion 421 is shown as blocked) and, possibly, a stage feedback deflector 424.

Referring again to FIG. 4, the resulting ebeam 426 ultimately impinges as a spot 428 on a surface of a wafer 430, such as a silicon wafer used in IC manufacture. Specifically, the resulting ebeam may impinge on a photoresist layer on the wafer, but embodiments are not so limited. A stage scan 432 moves the wafer 430 relative to the beam 426 along the direction of the arrow 434 shown in FIG. 4. It is to be appreciated that an ebeam tool in its entirety may include numerous columns 400 of the type depicted in FIG. 4. Also, as described in some embodiments below, the ebeam tool may have an associated base computer, and each column may further have a corresponding column computer.

One drawback of state-of-the-art e-beam lithography is that it is not readily adoptable into a high volume manufacturing (HVM) environment for advanced integrated circuit manufacturing. Today's e-beam tooling and associated methodology has proven to be too slow with respect to throughput requirements for HVM wafer processing. Embodiments described herein are directed to enabling the use of EBL in an HVM environment. In particular, many embodiments described herein enable improved throughput in an EBL tool to allow for the use of EBL in an HVM environment. Described below are different embodiments that can improve EBL beyond its current capabilities. It is to be appreciated that, although broken out as distinct aspects of embodiments, embodiments described below may be used independently or in any suitable combination to achieve improvements in EBL throughput for an HVM environment.

For all aspects, in an embodiment, when referring below to openings or apertures in a blanker aperture array (BAA), all or some of the openings or apertures of the BAA can be switched open or "closed" (e.g., by beam deflecting) as the wafer/die moves underneath along a wafer travel or scan direction. In one embodiment, the BAA can be independently controlled as to whether each opening passes the ebeam through to the sample or deflects the beam into, e.g., a Faraday cup or blanking aperture. The ebeam column or apparatus including such a BAA may be built to deflect the overall beam coverage to just a portion of the BAA, and then individual openings in the BAA are electrically configured to pass the ebeam ("on") or not pass ("off"). For example, un-deflected electrons pass through to the wafer and expose a resist layer, while deflected electrons are caught in the Faraday cup or blanking aperture. It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut. As an example provided below, the spots generated from the BAA 700 have a pitch the same as the pitch of the lines 708 (when both columns 702 and 704 of BAA openings are considered together). Meanwhile, the spots generated from only one column of the staggered array of the BAA 700 have twice the pitch as the pitch of the lines 708.

For all aspects, it is also to be appreciated that, in some embodiments, an ebeam column as described above may also include other features in addition to those described in association with FIG. 4. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage. Other additional embodiments are described below in association with FIGS. 15-17.

Figure 5:
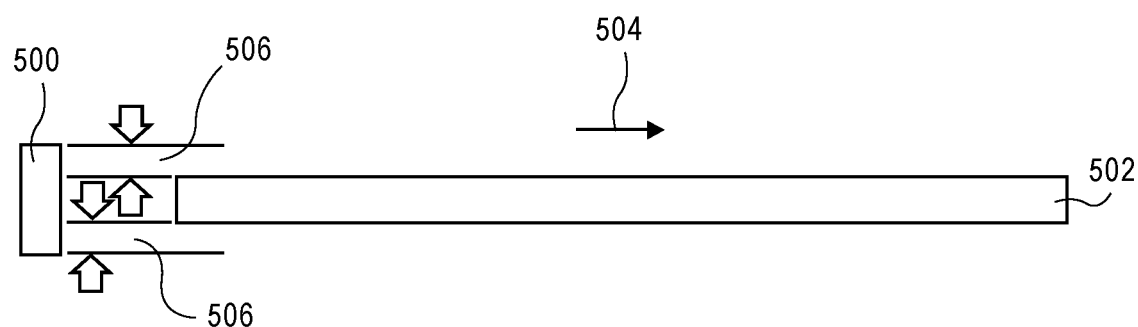
FIG. 5 illustrates an aperture (left) of a BAA relative to a line (right) to be cut or to have vias placed in targeted locations while the line is scanned under the aperture.

As a general exemplary embodiment to provide context for more detailed embodiments, a staggered beam aperture array is implemented to solve throughput of an ebeam machine while also enabling minimum line pitch. With no stagger, consideration of edge placement error (EPE) means that a minimum pitch that is twice the line width cannot be cut since there is no possibility of stacking vertically in a single stack. For example, FIG. 5 illustrates an aperture 500 of a BAA relative to a line 502 to be cut or to have vias placed in targeted locations while the line is scanned along the direction of the arrow 504 under the aperture 500. Referring to FIG. 5, for a given line 502 to be cut or vias to be placed, the EPE 506 of the cutter opening (aperture) results in a rectangular opening in the BAA grid that is the pitch of the line.

Figure 6:
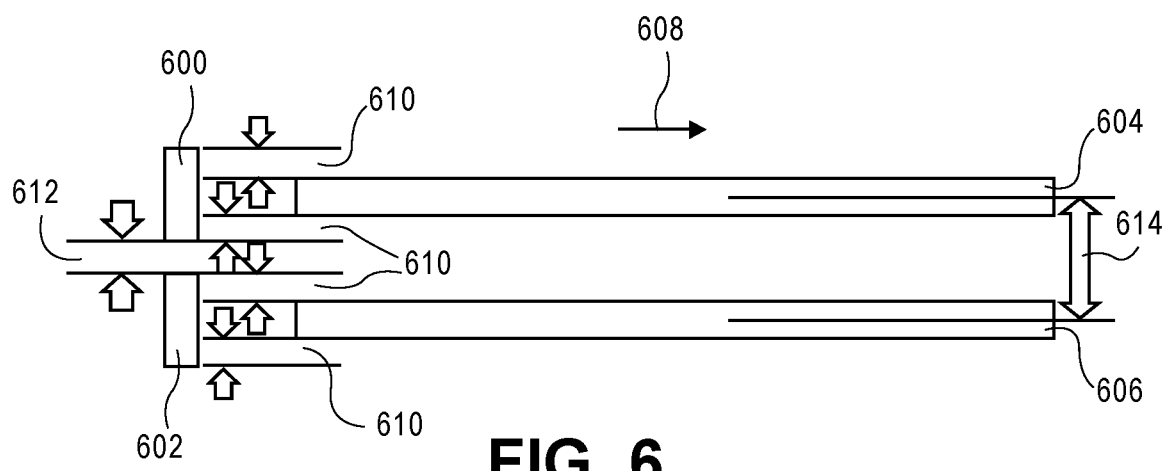
FIG. 6 illustrates two non-staggered apertures (left) of a BAA relative to two lines (right) to be cut or to have vias placed in targeted locations while the lines are scanned under the apertures.

FIG. 6 illustrates two non-staggered apertures 600 and 602 of a BAA relative to two lines 604 and 606, respectively, to be cut or to have vias placed in targeted locations while the lines are scanned along the direction of the arrow 608 under the apertures 600 and 602. Referring to FIG. 6, when the rectangular opening 500 of FIG. 5 is placed in a vertical single column with other such rectangular openings (e.g., now as 600 and 602), the allowed pitch of the lines to be cut is limited by 2× EPE 610 plus the distance requirement 612 between the BAA opens 600 and 602 plus the width of one line 604 or 606. The resulting spacing 614 is shown by the arrow on the far right of FIG. 6. Such a linear array would severely limit the pitch of the wiring to be substantially greater than 3-4× of the width of the lines, which may be unacceptable. Another unacceptable alternative would be to cut tighter pitch lines in two (or more) passes with slightly offset line locations. Such an approach could severely limit the throughput of the ebeam machine.

Figure 7:
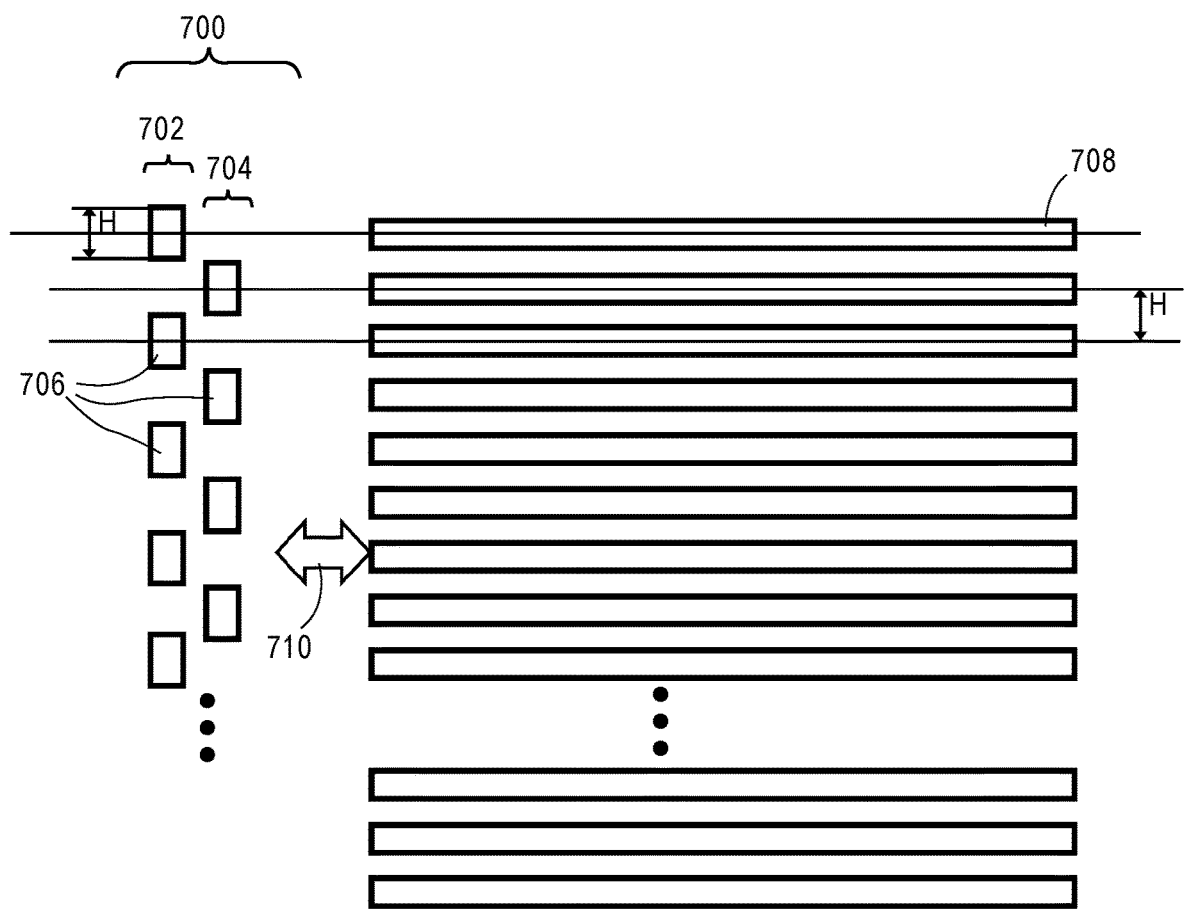
FIG. 7 illustrates two columns of staggered apertures (left) of a BAA relative to a plurality of lines (right) to be cut or to have vias placed in targeted locations while the lines are scanned under the apertures, with scanning direction shown by the arrow, in accordance with an embodiment of the present invention.

By contrast to FIG. 6, FIG. 7 illustrates two columns 702 and 704 of staggered apertures 706 of a BAA 700 relative to a plurality of lines 708 to be cut or to have vias placed in targeted locations while the lines 708 are scanned along the direction 710 under the apertures 706, with scanning direction shown by the arrow, in accordance with an embodiment of the present invention. Referring to FIG. 7, a staggered BAA 700 includes two linear arrays 702 and 704, staggered spatially as shown. The two staggered arrays 702 and 704 cut (or place vias at) alternate lines 708. The lines 708 are, in one embodiment, placed on a tight grid at twice the line width. As used throughout the present disclosure, the term staggered array can refer to a staggering of openings 706 that stagger in one direction (e.g., the vertical direction) and either have no overlap or have some overlap when viewed as scanning in the orthogonal direction (e.g., the horizontal direction). In the latter case, the effective overlap provides for tolerance in misalignment, as is described in much greater detail below.

It is to be appreciated that, although a staggered array is shown herein as two vertical columns for simplicity, the openings or apertures of a single "column" need not be columnar in the vertical direction. For example, in an embodiment, so long as a first array collectively has a pitch in the vertical direction, and a second array staggered in the scan direction from the first array collectively has the pitch in the vertical direction, the staggered array is achieved. Thus, reference to or depiction of a vertical column herein can actually be made up of one or more columns unless specified as being a single column of openings or apertures. In one embodiment, in the case that a "column" of openings is not a single column of openings, any offset within the "column" can be compensated with strobe timing. In an embodiment, the critical point is that the openings or apertures of a staggered array of a BAA lie on a specific pitch in the first direction, but are offset in the second direction to allow them to place cuts or vias without any gap between cuts or vias in the first direction.

Thus, one or more embodiments are directed to a staggered beam aperture array where openings are staggered to allow meeting EPE cuts and/or via requirements as opposed to an inline arrangement that cannot accommodate for EPE technology needs. By contrast, with no stagger, the problem of edge placement error (EPE) means that a minimum pitch that is twice the line width cannot be cut since there is no possibility of stacking vertically in single stack. Instead, in an embodiment, use of a staggered BAA enables much greater than 4000 times faster than individually ebeam writing each line location. Furthermore, a staggered array allows a line pitch to be twice the line width. In a particular embodiment, an array has 4096 staggered openings over two columns such that EPE for each of the cut and via locations can be made. It is to be appreciated that a staggered array, as contemplated herein, may include two or more columns of staggered openings.

In an embodiment, use of a staggered array leaves space for including metal around the apertures of the BAA which contain one or two electrodes for passing or steering the ebeam to the wafer or steering to a Faraday cup or blanking aperture. That is, each opening may be separately controlled by electrodes to pass or deflect the ebeam. In one embodiment, the BAA has 4096 openings, and the ebeam apparatus covers the entire array of 4096 openings, with each opening electrically controlled. Throughput improvements are enabled by sweeping the wafer under the opening as shown by the thick black arrows.

In another aspect, when patterning small cuts and vias in photoresist using a fixed aperture array in the path of an ebeam that scans relative to a wafer, the coulombic interaction of the electrons inside the column can cause a shift in the focal plane of the beam at the photoresist. A dense pattern with a larger number of open apertures will have a larger number of electrons going through the column compared to a sparse pattern. Since the coulombic interaction increases with beam current, this discrepancy may result in a large optimal focus variation between the sparse and dense patterns, reducing the process margin. Additionally, it is typically the case that the best focal plane depends on current in column.

In accordance with one or more embodiments of the present invention, processes described below provide a solution that reduces otherwise large variations in current density through the column. In an embodiment, a fill pattern is added to increase lithography process margin. In one such embodiment, dummy fill patterns are added in areas of lower pattern density to reduce current density variation passing through the column.

Figure 8:
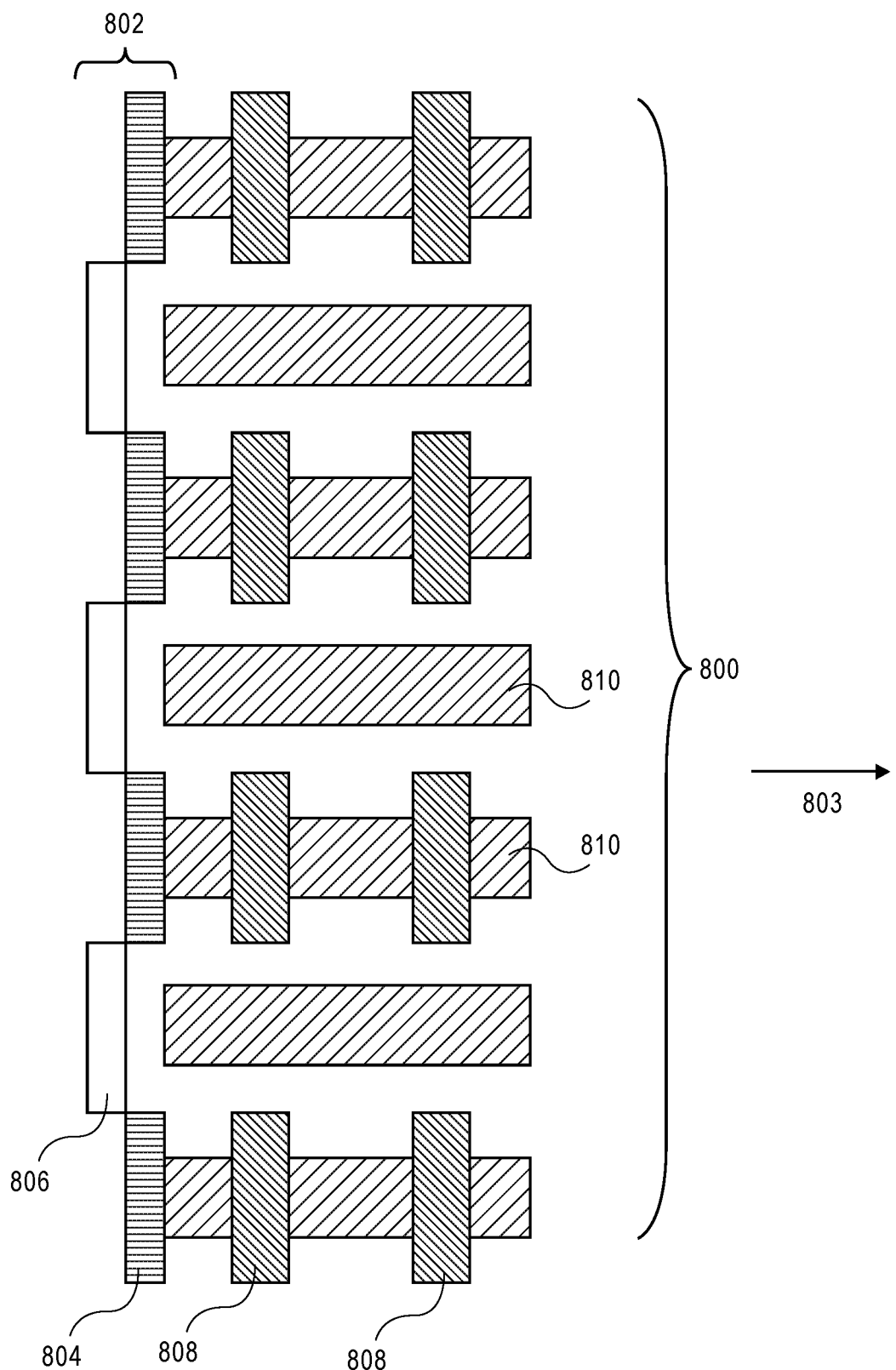
FIG. 8 illustrates a schematic of a high density layout having a large number of vias/cuts laid out on a grid, in accordance with an embodiment of the present invention.

To provide context for the issues described immediately above, FIG. 8 illustrates a schematic of a high density layout having a large number of vias/cuts laid out on a grid, in accordance with an embodiment of the present invention.

Referring to FIG. 8, the schematic shows an array of cuts/vias 808 on a line grid 800, e.g., of metal lines 810. An aperture array 802 is used to pattern the vias/cuts 808 as the wafer scans relative to the aperture array, i.e., along direction 803. In the aperture array, open apertures 804 allow electrons to pass through a BAA. Closed apertures 806 block electrons and inhibit them from passing through the BAA. Typically, the cuts 808 are aligned such that many apertures used to create these features turn on/off at the same time.

Figure 9:
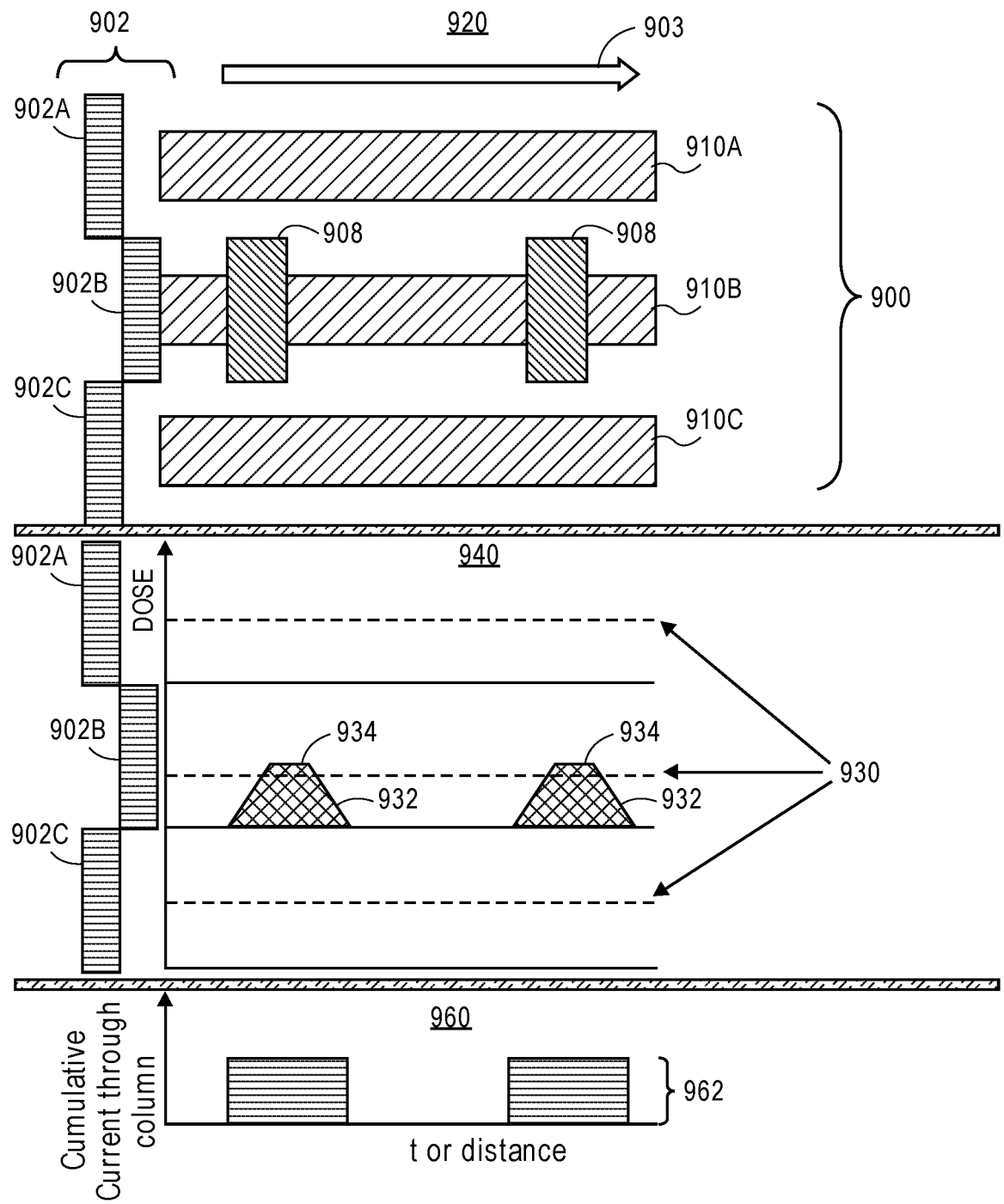
FIG. 9 illustrates a schematic representing formation of vias/cuts, the corresponding dose profile, and the corresponding profile of current through the column, in accordance with an embodiment of the present invention.

To provide further context, FIG. 9 illustrates a schematic representing formation of vias/cuts, the corresponding dose profile, and the corresponding profile of current through the column, in accordance with an embodiment of the present invention.

Referring to FIG. 9, the schematic 920 shows two cuts/vias 908 on a middle line 910B of a line grid 900, e.g., of three metal lines 910A, 910B and 910C. An aperture array 902, having three apertures 902A, 902B and 902C for illustrative purposes, is used to pattern the vias/cuts 908 as the wafer scans relative to the aperture array 902, i.e., along scan direction 903. To create such a pattern, the aperture array 902 is brought across the wafer in the direction of the metal lines 900. When aperture 902B is above the location to be patterned, it is opened to allow the electrons to pass through the column.

Referring again to FIG. 9, a corresponding dose profile 940 is shown in the scan direction. The dose profile is provided for each aperture 902A, 902B and 902C. Threshold doses 930 are shown (dashed lines), which represent a dose amount needed to effectively "expose" an underlying resist to form ultimately for the vias/cuts 908 (e.g., the minimum dose required to clear the photoresist). Along the line associated with aperture 902B, in locations 932 where the dose is above the corresponding threshold dose 930, i.e., where spikes 934 are present, the vias/cuts 908 are ultimately formed. Zero to negligible dose is indicated along the line associated with aperture 902A and along the line associated with aperture 902C. A corresponding plot 960 of cumulative current passing through the column is also depicted, as a function or time (t) or distance.

Referring collectively to all portions of FIG. 9, along the scan direction 903, as the aperture 902B is opened, the dose deposited at the wafer slowly ramps up from zero (or a constant baseline background dose ib) to a peak value. Similarly, after the aperture is closed, it ramps down to ib. The size of the patterned area is determined by the distance over which this dose is greater than the threshold dose 930. Correspondingly, the current in the column rises sharply as the aperture array 902 scans over the locations of the via/cut patterns 908. The large variation in current through the column results in a large focus variation, e.g., between zero and a cumulative current value 962, as is depicted. Compensation for such large focus variation may not be easy and, in fact, may not be possible.

Figure 10:
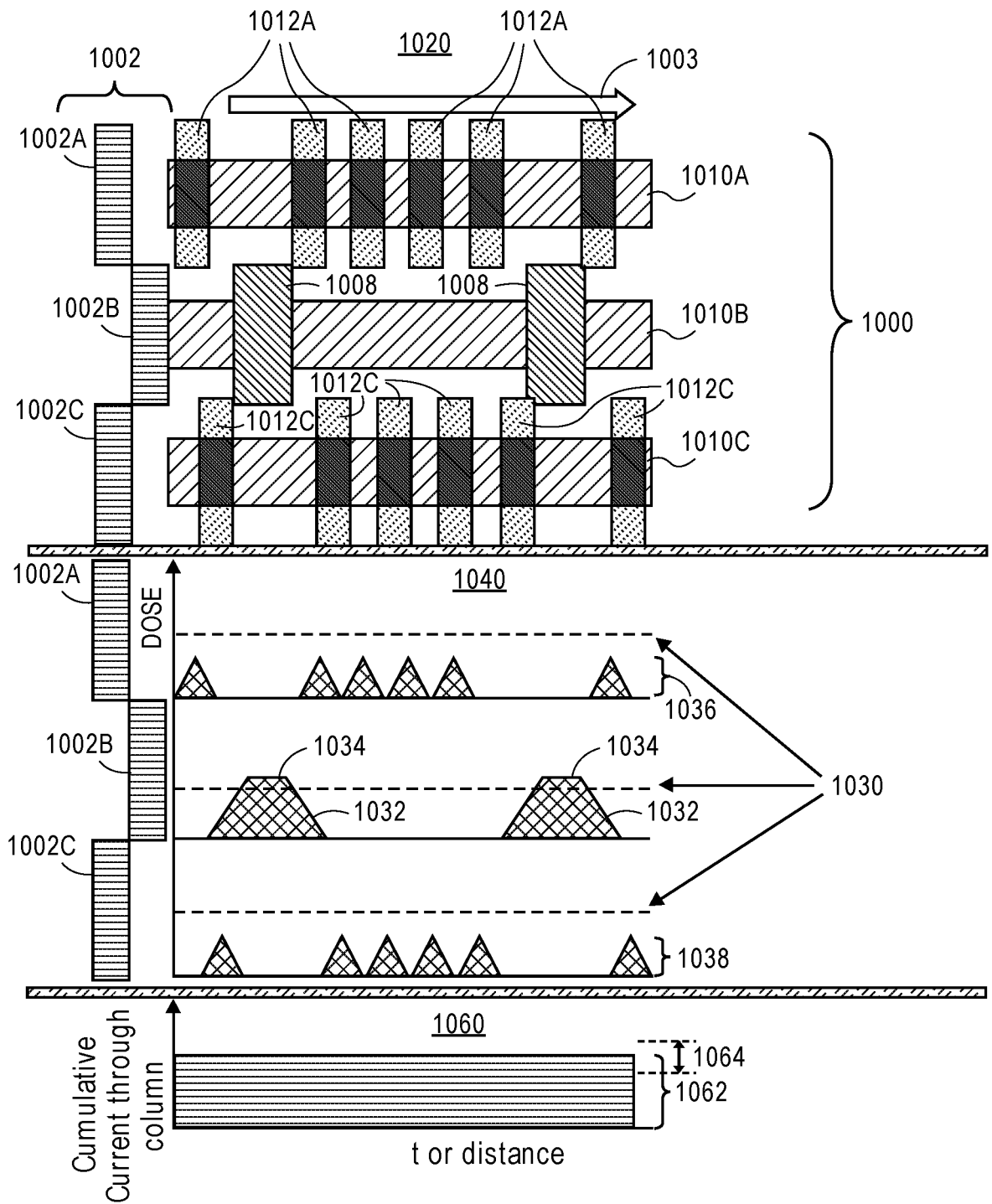
FIG. 10 illustrates another schematic representing formation of vias/cuts along with sub resolution patterns, the corresponding dose profile, and the corresponding profile of current through the column, in accordance with an embodiment of the present invention.

Contrasting FIG. 9, FIG. 10 illustrates another schematic representing formation of vias/cuts along with sub resolution patterns, the corresponding dose profile, and the corresponding profile of current through the column, in accordance with an embodiment of the present invention.

Referring to FIG. 10, the schematic 1020 shows two cuts/vias 1008 on a middle line 1010B of a line grid 1000, e.g., of three metal lines 1010A, 1010B and 1010C. An aperture array 1002, having three apertures 1002A, 1002B and 1002C for illustrative purposes, is used to pattern the vias/cuts 1008 as the wafer scans relative to the aperture array 1002, i.e., along scan direction 1003. To create such a pattern, the aperture array 1002 is brought across the wafer in the direction of the metal lines 1000. When aperture 1002B is above the location to be patterned, it is opened to allow the electrons to pass through the column. Additionally, sub resolution patterns 1012A are formed along line 1010A, and sub resolution patterns 1012C are formed along line 1010C. The sub resolution patterns 1012A and 1012C do not ultimately print vias/cuts along lines 1010A and 1010C, respectively.

Referring again to FIG. 10, a corresponding dose profile 1040 is shown in the scan direction 1003. The dose profile is provided for each aperture 1002A, 1002B and 1002C. Threshold doses 1030 are shown (dashed lines), which represent a dose amount needed to effectively "expose" an underlying resist to form ultimately for the vias/cuts 1008 (e.g., the minimum dose required to clear the photoresist).

Along the line associated with aperture 1002B, in locations 1032 where the dose is above the corresponding threshold dose 1030, i.e., where spikes 1034 are present, the vias/cuts 1008 are ultimately formed. Along the line associated with aperture 1002A, in locations 1036, there is a measured dose associated with the locations of sub resolution patterns 1012A. However, the dose is not above the corresponding threshold dose 1030, i.e., spikes are not present. Likewise, along the line associated with aperture 1002C, in locations 1038, there is a measured dose associated with the locations of sub resolution patterns 1012C. However, the dose is not above the corresponding threshold dose 1030, i.e., spikes are not present. Accordingly, vias/cuts are not ultimately formed at locations 1036 and 1038 associated with the locations of sub resolution patterns 1012A and 1012C, respectively. That is, in contrast to locations 1032 where cuts/vias 1008 are desired, sub resolution patterns 1012A and 1012C do not result in above-threshold dose locations.

Referring again to FIG. 10, a corresponding plot 1060 of cumulative current passing through the column is also depicted, as a function of time (t) or distance. In an embodiment, the cummulative current through the column is now non-zero and is uniform or at least substantially uniform throughout time and/or distance, e.g., with a non-zero and uniform or at least substantially uniform cumulative current value 1062 at all positions along the time or distance axis. In an embodiment, variation 1064 in cumulative current in column at any point along the time or distance axis is less than 50% of the cumulative current value 1062. In one such embodiment, variation 1064 in cumulative current in column at any point along the time or distance axis is less than 30% of the cumulative current value 1062. In a specific such embodiment, variation 1064 in cumulative current in column at any point along the time or distance axis is less than 10% of the cumulative current value 1062.

Referring collectively to all portions of FIG. 10, in an embodiment, various sub-resolution features 1012A and/or 1012C are placed to provide a more uniform density current density distribution through the column. The sub-resolution features 1012A and/or 1012C are manifested as very short open-close times for the apertures 1002A and 1002C, respectively. Since the slope of the dose ramp along the scan direction 1003 is the same for both short and long open times, the dose deposited on the wafer by the short open times does not have an opportunity to reach the threshold dose 1030 required to open (effectively "expose") the photoresist. By strategically placing the sub-resolution features 1012A and/or 1012C, a minimal variation 1064 in cumulative current 1062 though the column is achieved.

Contrasting FIG. 10 to FIG. 9 again, FIG. 10 illustrates an example where a large current variation described in association with Figure is reduced to almost no current variation. Although sub-resolution features 1012A and/or 1012C are formed in locations where vias/cuts 1008 are not desired, they are only opened briefly to a level that contributes to the accumulated current density in the column but below a threshold 1030 which is required for the features to print. In a particular embodiment, as is depicted in FIG. 10, the sub-resolution features 1012A and/or 1012C are staggered relative to one another when taken along lines 1010A and 1010C, respectively. The staggering allows for providing of current in the column without providing enough dose to surpass the threshold dose 1030 in such "dummy" locations.

In accordance with an embodiment of the present invention, then, a method of forming a pattern for a semiconductor structure includes forming a pattern of parallel lines 1000 above a substrate. The method also includes aligning the substrate in an e-beam tool to provide the pattern of parallel lines 1000 parallel with a scan direction 1003 of the e-beam tool. The e-beam tool includes a column having a blanker aperture array (BAA) with a staggered pair of columns of openings 1002 along an array direction orthogonal to the scan direction 1003. The method also includes forming a pattern of cuts or vias 1008 in or above the pattern of parallel lines 1000 to provide line breaks for the pattern of parallel lines 1000 by scanning the substrate along the scan direction 1003. A cumulative current through the column has a non-zero and substantially uniform cumulative current value 1062 throughout the scanning.

In an embodiment, a variation 1064 in the cumulative current through the column is less than 50% of the cumulative current value 1062 throughout the scanning. In one such embodiment, the variation 1064 in the cumulative current through the column is less than 10% of the cumulative current value 1062 throughout the scanning.

In a particular embodiment, referring again to FIG. 10, a sub resolution pattern (e.g., 1012A or 1012C or both 1012A and 1012C) is formed throughout the scanning. In one such embodiment, the pattern of cuts or vias 1008 is staggered from the sub resolution pattern (e.g., 1012A or 1012C or both 1012A and 1012C) along the scan direction 1003, as is depicted in FIG. 10. In an embodiment, the pattern of cuts or vias 1008 is formed along a first line 1010B of the pattern of parallel lines 1000, and the sub resolution pattern 1012A or 1012C is formed along a second line 1010A or 1010C, respectively, of the pattern of parallel lines 1000. In a particular such embodiment, the second line is directly adjacent to a first side of the first line. In one embodiment, the sub resolution pattern is further formed along a third line (the other of 1010A or 1010C) of the pattern of parallel lines 1000. In a particular such embodiment, the third line (the other of 1010A or 1010C) is directly adjacent to a second side of the first line 1010B opposite the first side of the first line, i.e., opposite the second line 1010A or 1010C relative to the array direction, as is depicted in FIG. 10.

In another embodiment, the above approach is extended to allow the sub resolution patterns 1012A and 1012C features to actually resolve by increasing the aperture open time. That is, in another embodiment, the dose is permitted to cross the threshold values. The printed features are placed at locations where they do not impact the circuit, e.g., at one or more of locations 1036 and 1038, and, hence are "dummy" features. An example of such a location is one where there is no underlying or overlying metal for a via to connect to. Another example of such a location is a hard mask location that does not allow the formation of a via beyond lithographic processing. In either case, the dose is sufficient to print but it is printed in effectively "dead" locations. The net effect on the column is the same, in that variation of cumulative current through column is mitigated. Thus, in another embodiment, one or more dummy cuts or vias is formed throughout the scanning.

It is to be appreciated that implementation of embodiments involving the use of such dummy fill patterns as described above may not require modification to the column design, or the addition of lens elements in the column to compensate for varying focus. To provide context, adding lens elements to dynamically control focus can otherwise be challenging and expensive. It is also to be appreciated that another approach to counter the above described discrepancy for dense and sparse patterns may be to modify the via/cut layout. However, such an approach would likely otherwise result in greater design complexities on the part of chip designers.

Implementation of one or more of the above described embodiments may render the use of ebeam direct write feasible with a relatively large process window. In particular, embodiments may enable reducing or eliminating the need for design changes that would otherwise have to be made while designing the chip layouts. Such design changes would otherwise likely result in a smaller pattern density of cuts/vias, increasing the size/cost of the chip. In an embodiment, a large variation in pattern density without the use of active focusing lens elements or hardware based techniques on the tool is indicative of the use of approaches described above.

It is to be appreciated that the embodiments described above may be implemented for a BAA having a staggered pair of columns of openings that is a non-overlapping staggered pair of columns of openings, as is depicted in FIGS. 7-10. However, in accordance with another embodiment of the present invention, aperture size modulation is implemented to enhance e-beam patterning resolution. To provide context, when patterning small cuts and vias in photoresist that depend on the generation of secondary electrons for exposure, such as using an EUV source in an EUV lithography system or a shaped beam aperture in an e-beam lithography system, the final pattern on the resist may be different from the intended pattern exposed. Not to be bound by theory, the phenomenon may be due to a finite scattering distance of the secondary electrons which leads to a rounding and a loss of aspect ratio of the intended via/cut.

In one approach to addressing the above issues, designs for apertures are implemented that are drawn to the desired aspect ratio to allow for tightest pitches to be patterned by turning off every other aperture. By contrast, one or more embodiments described below allow for patterning of small vias and cuts in the desired aspect ratio, while also increasing the resolution of the smallest printable features. In one such embodiment, adjacent apertures in a multi-aperture based e-beam column are allowed to overlap. The overlap increases the aspect ratio of the aperture to compensate for the loss of aspect ratio in the resist. In an embodiment, the increased sizing further has the benefit of allowing more energy through the apertures thereby increasing the throughput of the tool.

In an embodiment, the overlapping apertures are referred to as an overlapping staggered pair of columns of openings, staggered overlapping apertures or staggered and overlapping apertures. In one embodiment, the overlap is at least 5% but less than 50% of dimension of opening in same direction as overlap. It is to be appreciated that an overlap of 50% or greater would mean that within one portioned column of the staggered column would no longer have discrete openings. In a specific embodiment, the extent of the overlap (i.e., the delta) is 10-25% of the dimension of opening in same direction (L) as the overlap delta. With respect to the image projected on wafer, in an embodiment, the overlap is at least 1 nanometer of overlap and up to 6-7 nanometers of image overlap. It is to be appreciated that the extent of workable may be resist dependent. With respect to the actual opening in a BAA (which is approximately 40× the image), in an embodiment, an image projected as 20 nm×10 nm on the wafer translates to approximately 0.8 microns×0.4 microns. Thus, in one embodiment, at least 40 nanometer overlap is formed in staggered adjacent openings on a BAA and possibly up to 240 nanometers-280 nanometers. It is to be appreciated that the actual overlap may be based on manufacturability in a silicon wafer or slice used to make the BAA.

In accordance with an embodiment of the present invention, a blanker aperture array (BAA) for an e-beam tool includes a first column of openings along a first direction and having a pitch. Each opening of the first column of openings has a dimension in the first direction. A second column of openings is along the first direction and staggered from the first column of openings. The second column of openings has the pitch. Each opening of the second column of openings has the dimension in the first direction. A scan direction of the BAA is along a second direction orthogonal to the first direction. The openings of the first column of openings overlap with the openings of the second column of openings by at least 5% but less than 50% of the dimension of openings in the first direction when scanned along the second direction. In a particular embodiment, the openings of the first column of openings overlap with the openings of the second column of openings between 5% and 25% of the dimension in the first direction when scanned along the second direction.

In an embodiment, a scan performed using non-overlapping apertures versus overlapping apertures at the same input dose demonstrates that using overlapping apertures can resolve features that were previously unresolvable. The aperture sizes, dose and scan length were kept constant between the two images. The image resulting from overlapping apertures is improved over the image resulting from non-overlapping apertures by increasing the electron concentration. In an embodiment, printed features are smaller and drawn closer to the design specification when overlapping apertures are implemented.

In contrast to FIGS. 7-10, FIG. 11 illustrates two columns of staggered overlapping apertures (left) of a BAA relative to a plurality of lines (right) to be cut or to have vias placed in targeted locations while the lines are scanned under the apertures, with scanning direction shown by the arrow, in accordance with an embodiment of the present invention.

Figure 11:
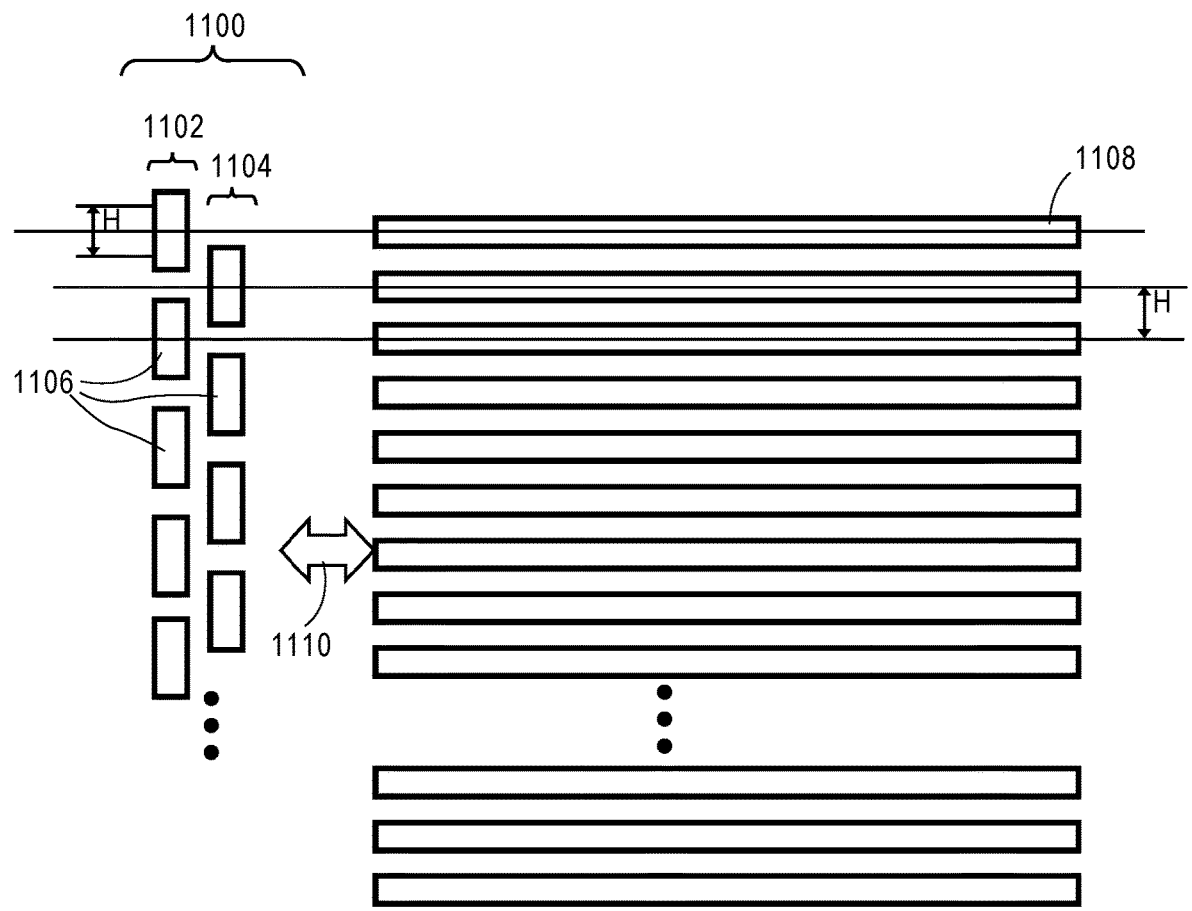
FIG. 11 illustrates two columns of staggered overlapping apertures (left) of a BAA relative to a plurality of lines (right) to be cut or to have vias placed in targeted locations while the lines are scanned under the apertures, with scanning direction shown by the arrow, in accordance with an embodiment of the present invention.

FIG. 11 illustrates two columns 1102 and 1104 of staggered overlapping apertures 1106 of a BAA 1100 relative to a plurality of lines 1108 to be cut or to have vias placed in targeted locations while the lines 1108 are scanned along the direction 1110 under the apertures 1106, with scanning direction shown by the arrow, in accordance with an embodiment of the present invention. Referring to FIG. 11, a staggered BAA 1100 includes two linear arrays 1102 and 1104, staggered spatially as shown. The two staggered arrays 1102 and 1104 cut (or place vias at) alternate lines 1108. The lines 1108 are, in one embodiment, placed on a tight grid at twice the line width. As used throughout the present disclosure, the term staggered array can refer to a staggering of openings 1106 that stagger in one direction (e.g., the vertical direction) and further have overlap when viewed as scanning in the orthogonal direction (e.g., the horizontal direction). In an embodiment, the effective overlap provides for tolerance in misalignment, as described above.

Figure 12A:
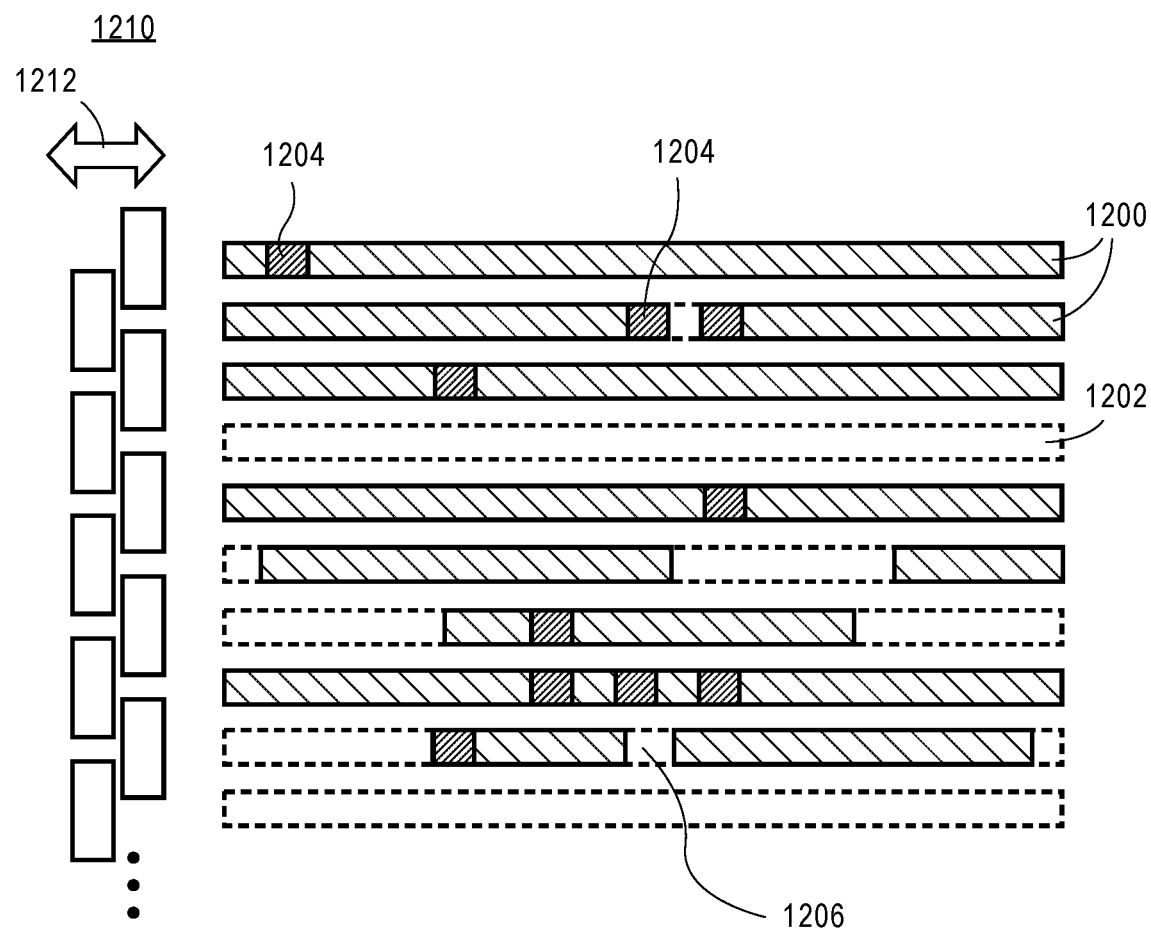
FIG. 12A illustrates two columns of staggered overlapping apertures (left) of a BAA relative to a plurality of lines (right) having cuts (breaks in the horizontal lines) or vias (filled-in boxes) patterned using the staggered BAA, with scanning direction shown by the arrow, in accordance with an embodiment of the present invention.

In a particular embodiment, a staggered BAA has two rows of staggered overlapping BAA openings. Such an array permits tight pitch lines, where line pitch can be 2× the line width. Furthermore, all lines can be cut in a single pass (or vias can be made in a single pass), thereby enabling throughput on the ebeam machine. FIG. 12A illustrates two columns of staggered overlapping apertures (left) of a BAA relative to a plurality of lines (right) having cuts (breaks in the horizontal lines) or vias (filled-in boxes) patterned using the staggered BAA, with scanning direction shown by the arrow, in accordance with an embodiment of the present invention.

Referring to FIG. 12A, the line result from a single staggered array could be as depicted, where lines are of single pitch, with cuts and vias patterned. In particular, FIG. 12A depicts a plurality of lines 1200 or open line positions 1202 where no lines exist. Vias 1204 and cuts 1206 may be formed along lines 1200. The lines 1200 are shown relative to a BAA 1210 having a scanning direction 1212. Thus, FIG. 12A may be viewed as a typical pattern produced by a single staggered array. Dotted lines show where cuts occurred in the patterned lines (including total cut to remove a full line or line portion). The via locations 1204 are patterning vias that land on top of the lines 1200.

In an embodiment, all or some of the openings or apertures of the BAA 1210 can be switched open or "closed" (e.g., beam deflecting) as the wafer/die moves underneath along the wafer travel direction 1212. In an embodiment, the BAA can be independently controlled as to whether each opening passes the ebeam through to the sample or deflects the beam into, e.g., a Faraday cup or blanking aperture. The apparatus may be built to deflect the overall beam coverage to just a portion of the BAA, and then individual openings in the BAA are electrically configured to pass the ebeam ("on") or not pass ("off"). It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut. As an example, the spots generated from the BAA 1210 have a pitch the same as the pitch of the lines 1200 (when both columns of BAA openings are considered together). Meanwhile, the spots generated from only one column of the staggered array of the BAA 1210 have twice the pitch as the pitch of the lines 1200.

Figure 15:
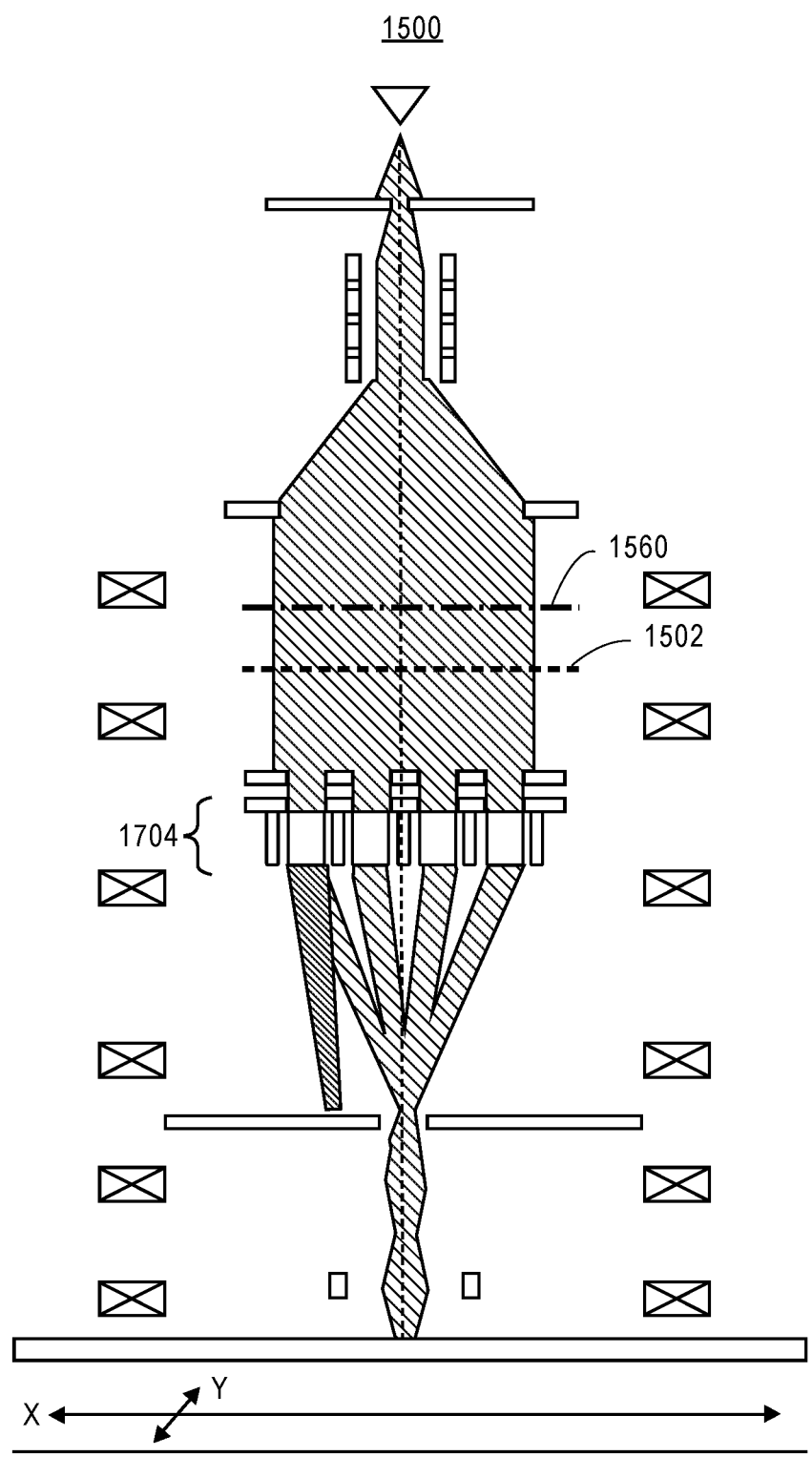
FIG. 15 includes a cross-sectional schematic representation of an ebeam column of an electron beam lithography apparatus having a deflector to shift the beam, in accordance with an embodiment of the present invention.
Figure 16:
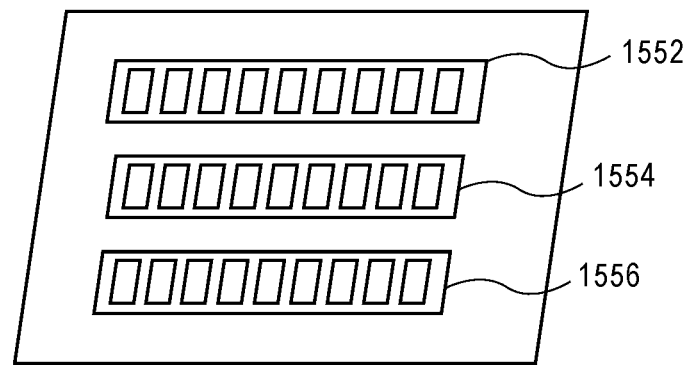
FIG. 16 illustrates a three (or up to n) pitch array for a BAA having pitch #1, cut #1, a pitch #2, cut #2 and a pitch #N, cut #N, in accordance with an embodiment of the present invention.
Figure 17:
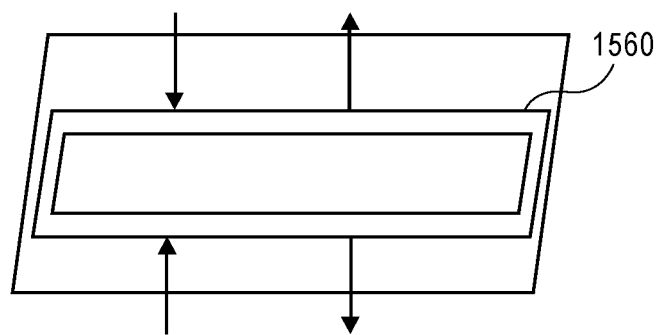
FIG. 17 illustrates a zoom in slit for inclusion on an ebeam column, in accordance with an embodiment of the present invention.

It is also to be appreciated that an ebeam column that includes a staggered beam aperture array (staggered BAA) as described above may also include other features in addition to those described in association with FIG. 4, some examples of which are further described in greater detail below in association with FIGS. 15-17. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage.

Figure 12B:
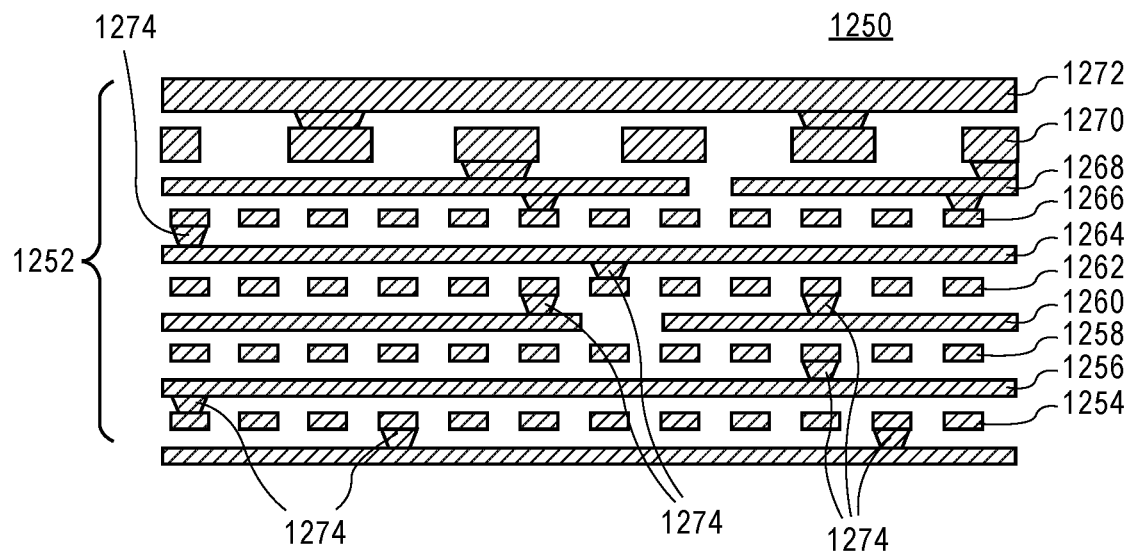
FIG. 12B illustrates a cross-sectional view of a stack of metallization layers in an integrated circuit based on metal line layouts of the type illustrated in FIG. 12A, in accordance with an embodiment of the present invention.

FIG. 12B illustrates a cross-sectional view of a stack 1250 of metallization layers 1252 in an integrated circuit based on metal line layouts of the type illustrated in FIG. 12A, in accordance with an embodiment of the present invention. Referring to FIG. 12B, in an exemplary embodiment, a metal cross-section for an interconnect stack 1250 is derived from a single BAA array for the lower eight matched metal layers 1254, 1256, 1258, 1260, 1262, 1264, 1266 and 1268. It is to be appreciated that upper thicker/wider metal lines 1270 and 1272 would not be made with the single BAA. Via locations 1274 are depicted as connecting the lower eight matched metal layers 1254, 1256, 1258, 1260, 1262, 1264, 1266 and 1268.

In another embodiment, a beam aperture array is implemented to solve throughput of an ebeam machine while also enabling minimum line pitch. As described above, with no stagger, the problem of edge placement error (EPE) means that a minimum pitch that is twice the line width cannot be cut since there is no possibility of stacking vertically in single stack. Embodiments described below extend the staggered BAA concept to permit three separate pitches to be exposed on a wafer, either through three passes, or by illuminating/controlling all three beam aperture arrays simultaneously in a single pass. The latter approach may be preferable for achieving the best throughput.

In some implementations, a three staggered beam aperture array is used instead of a single beam aperture array. The pitches of the three different arrays may either be related (e.g., 10-20-30) or unrelated pitches. The three pitches can be used in three separate regions on the target die, or the three pitches may occur simultaneously in the same localized region.

To provide context, the use of two or more single arrays would require a separate ebeam apparatus, or a change out of the beam aperture array for each different hole size/line pitch. The result would otherwise be a throughput limiter and/or a cost of ownership issue. Instead, embodiments described herein are directed to BAAs having more than one (e.g., three) staggered array. In one such embodiment (in the case of including three arrays on one BAA), three different arrays of pitches can be patterned on a wafer without loss of throughput. Furthermore, the beam pattern may be steered to cover one of the three arrays. An extension of this technique can be used to pattern any mixture of different pitches by turning on and off the blanker holes in all three arrays as needed.

Figure 13:
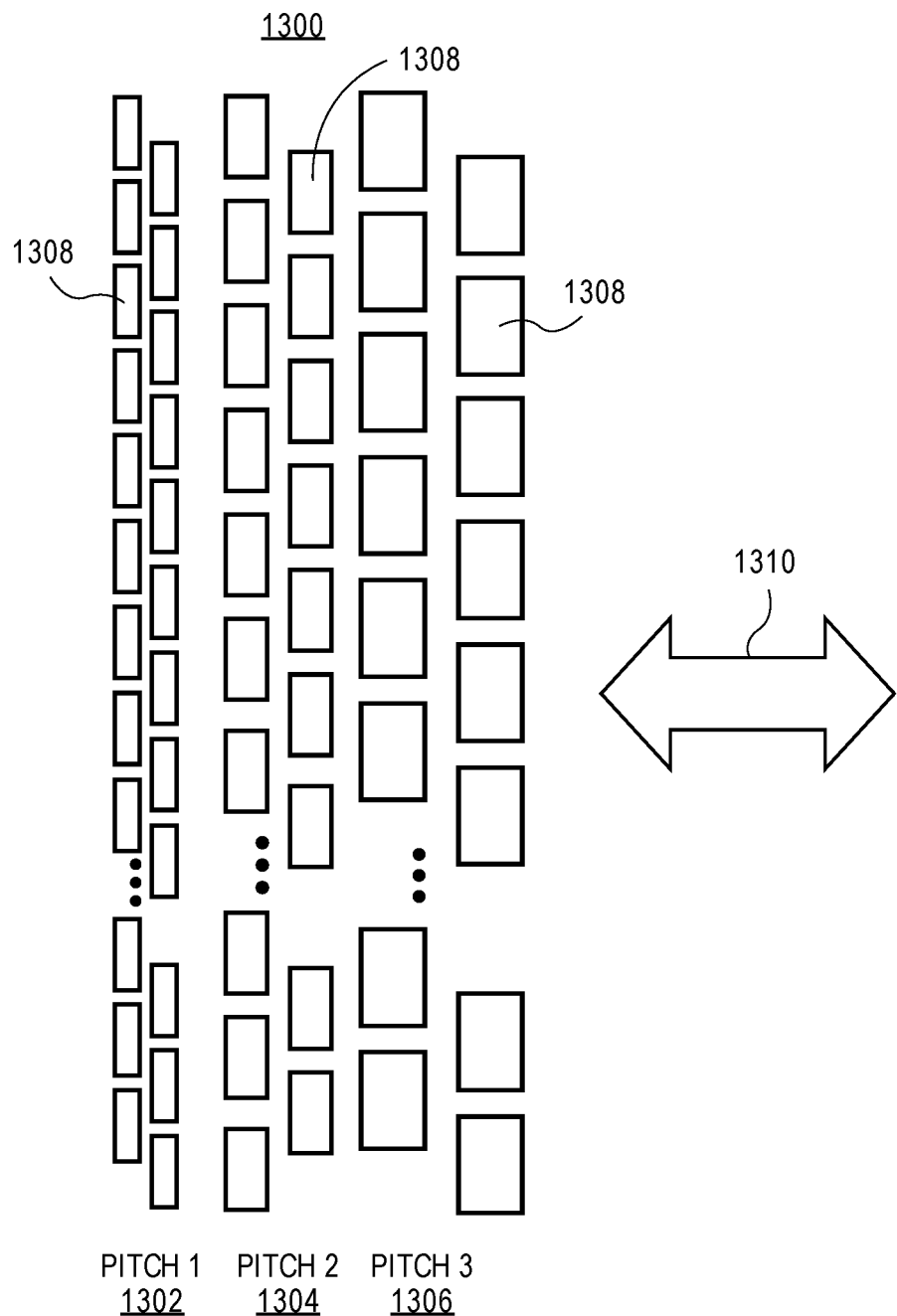
FIG. 13 illustrates apertures of a BAA having a layout of three different staggered overlapping arrays, in accordance with an embodiment of the present invention.
Figure 14:
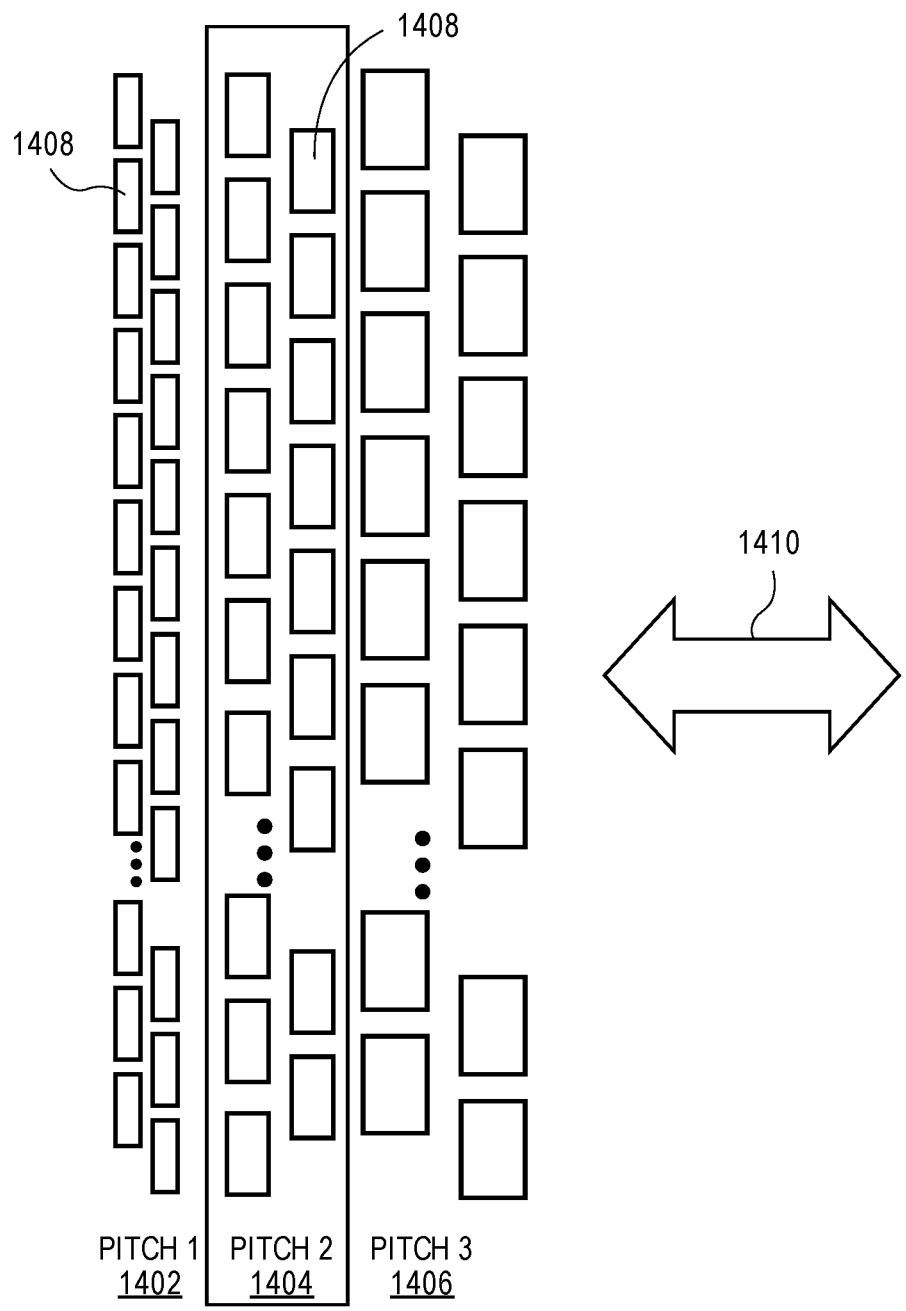
FIG. 14 illustrates apertures of a BAA having a layout of three different staggered overlapping arrays, where the ebeam covers only one of the arrays, in accordance with an embodiment of the present invention.

As an example, FIG. 13 illustrates apertures of a BAA 1300 having a layout of three different staggered arrays, in accordance with an embodiment of the present invention. Referring to FIG. 13, a three-column 1302, 1304 and 1306 blanker aperture array 1300 can be used for three different line pitches for cutting or making vias by all or some of the apertures 1308 which are switched open or "closed" (beam deflecting) as the wafer/die moves underneath along the wafer travel direction 1310. In one such embodiment, multiple pitches can be patterned without changing the BAA plate in the device. Furthermore, in a particular embodiment, multiple pitches can be printed at the same time. Both techniques allow many spots to be printed during a continuous pass of the wafer under the BAA. It is to be appreciated that while the focus of the description is on three separate columns of different pitches, embodiments can be extended to include any number of pitches that can fit within the apparatus, e.g., 1, 2, 3, 4, 5, etc. In an embodiment, within each of a given one of the three arrays, the openings are overlapping, in accordance with embodiments described above.

In an embodiment, the BAA can be independently controlled as to whether each opening passes the ebeam or deflects the beam into a Faraday cup or blanking aperture. The apparatus may be built to deflect the overall beam coverage to just a single pitch column, and then individual openings in the pitch column are electrically configured to pass the ebeam ("on") or not pass ("off"). As an example, FIG. 15 illustrates apertures 1508 of a BAA 1500 having a layout of three different staggered overlapping arrays 1502, 1504 and 1506, where the ebeam covers only one of the arrays (e.g., array 1504), in accordance with an embodiment of the present invention. In such an apparatus configuration, throughput could be gained for specific areas on a die that contain only a single pitch. The direction of travel of the underlying wafer is indicated by arrow 1510.

In one embodiment, in order to switch between pitch arrays, a deflector can be added to the ebeam column to allow the ebeam to be steerable onto the BAA pitch array. As an example, FIG. 15 includes a cross-sectional schematic representation of an ebeam column of an electron beam lithography apparatus having a deflector to shift the beam, in accordance with an embodiment of the present invention. Referring to FIG. 15, an ebeam column 1500, such as described in association with FIG. 4, includes a deflector 1502. The deflector can be used to shift the beam onto an appropriate pitch/cut row in a shaping aperture corresponding to an appropriate array of a BAA 1504 having multiple pitch arrays. As an example, FIG. 16 illustrates a three (or up to n) pitch array for a BAA 1550 having pitch #1, cut #1 (1552), a pitch #2, cut #2 (1554) and a pitch #N, cut #N (1556). It is to be appreciated that the height of cut #n is not equal to the height of cut #n+m.

Other features may also be included in the ebeam column 1500. For example, further referring to FIG. 15, in an embodiment, the stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage. In yet another example, FIG. 17 illustrates a zoom in slit 1560 for inclusion on an ebeam column. The positioning of such a zoom in slit 1560 on column 1500 is shown in FIG. 15. The zoom in slit 1560 may be included to keep efficiency for different cut heights. It is to be appreciated that one or more of the above described features may be included in a single ebeam column.

In another embodiment, the ebeam fully illuminates multiple or all columns of pitches on the BAA. In such a configuration, all of the illuminated BAA openings would be electrically controlled to be "open" to pass the ebeam to the die, or "off" to prevent the ebeam from reaching the die. The advantage of such an arrangement is that any combination of holes could be used to print line cuts or via locations without reducing throughput. While the arrangement described in association with FIGS. 15-17 could also be used to produce a similar result, a separate pass across the wafer/die for each of the pitch arrays would be required (which would reduce throughput by a factor of 1/n, where n is the number of pitch arrays on the BAA that require printing).

Figure 18:
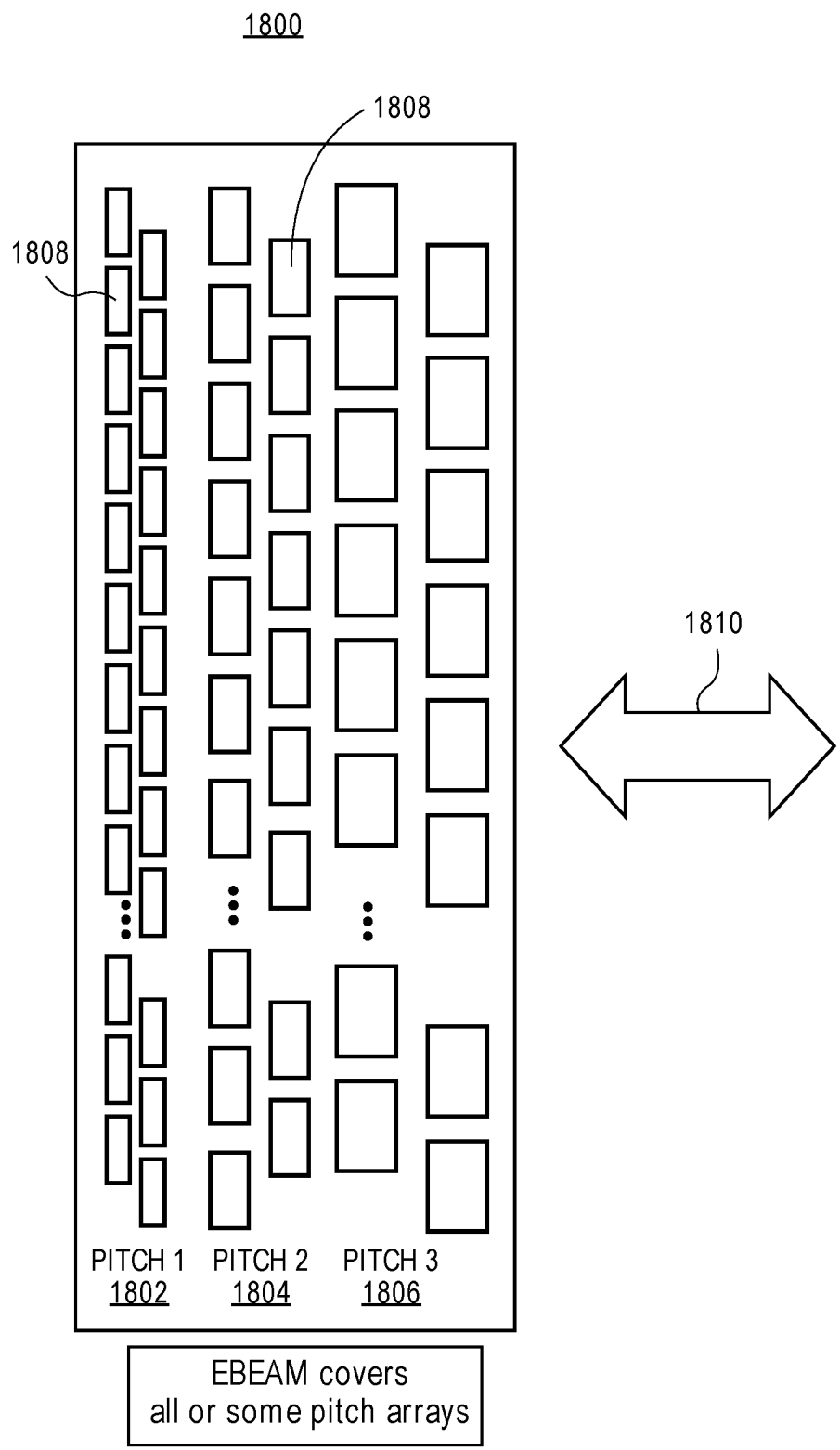
FIG. 18 illustrates apertures of a BAA having a layout of three different pitch staggered overlapping arrays, where the ebeam covers all of the arrays, in accordance with an embodiment of the present invention.

FIG. 18 illustrates apertures of a BAA having a layout of three different pitch staggered arrays (each an overlapping array), where the ebeam covers all of the arrays, in accordance with an embodiment of the present invention. Referring to FIG. 18, apertures 1808 of a BAA 1800 having a layout of three different staggered arrays 1802, 1804 and 1806, where the ebeam can cover all of the arrays (e.g., covers arrays 1802, 1804 and 1806), in accordance with an embodiment of the present invention. The direction of travel of the underlying wafer is indicated by arrow 1810.

Figure 19:
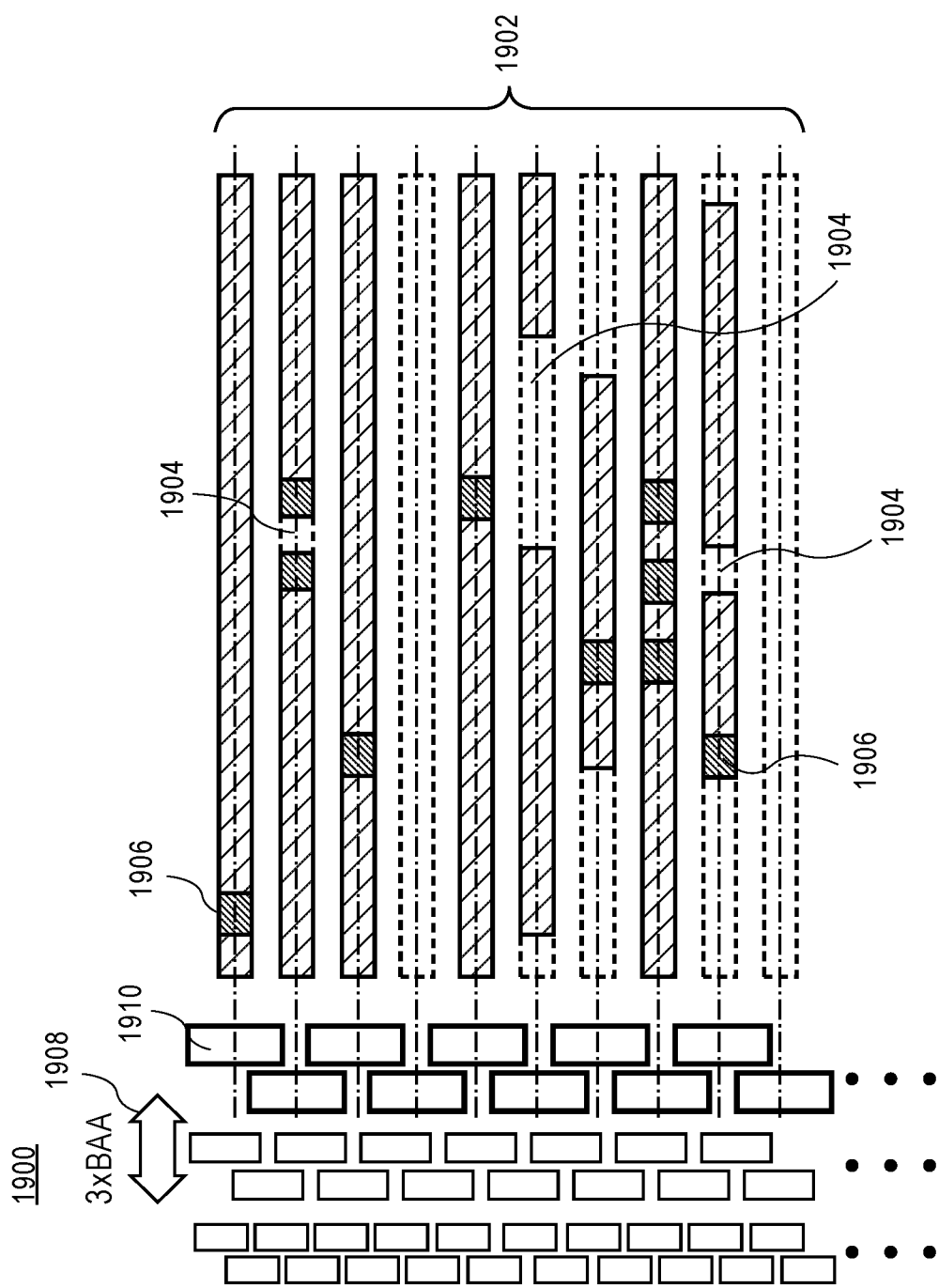
FIG. 19 illustrates a three beam staggered overlapping aperture array (left) of a BAA relative to a plurality of large lines (right) having cuts (breaks in the horizontal lines) or vias (filled-in boxes) patterned using the BAA, with scanning direction shown by the arrow, in accordance with an embodiment of the present invention.

In an embodiment, having three pitches of openings permits the cutting or via creation for three different line widths. However, the lines must be in alignment with the apertures of the corresponding pitch array. FIG. 19 illustrates a three beam staggered overlapping aperture array 1900 of a BAA relative to a plurality of large lines 1902 having cuts (e.g., breaks 1904 in the horizontal lines) or vias (filled-in boxes 1906) patterned using the BAA, with scanning direction shown by the arrow 1908, in accordance with an embodiment of the present invention. Referring to FIG. 19, all the lines in a local region are of the same size (in this case, corresponding to the largest apertures 1910 on the right side of the BAA). Thus, FIG. 19 illustrates a typical pattern produced by one of three staggered beam aperture arrays. Dotted lines show where cuts occurred in patterned lines. Dark rectangles are patterning vias that land on top of the lines 1902. In this case, only the largest blanker array is enabled.

Figure 20:
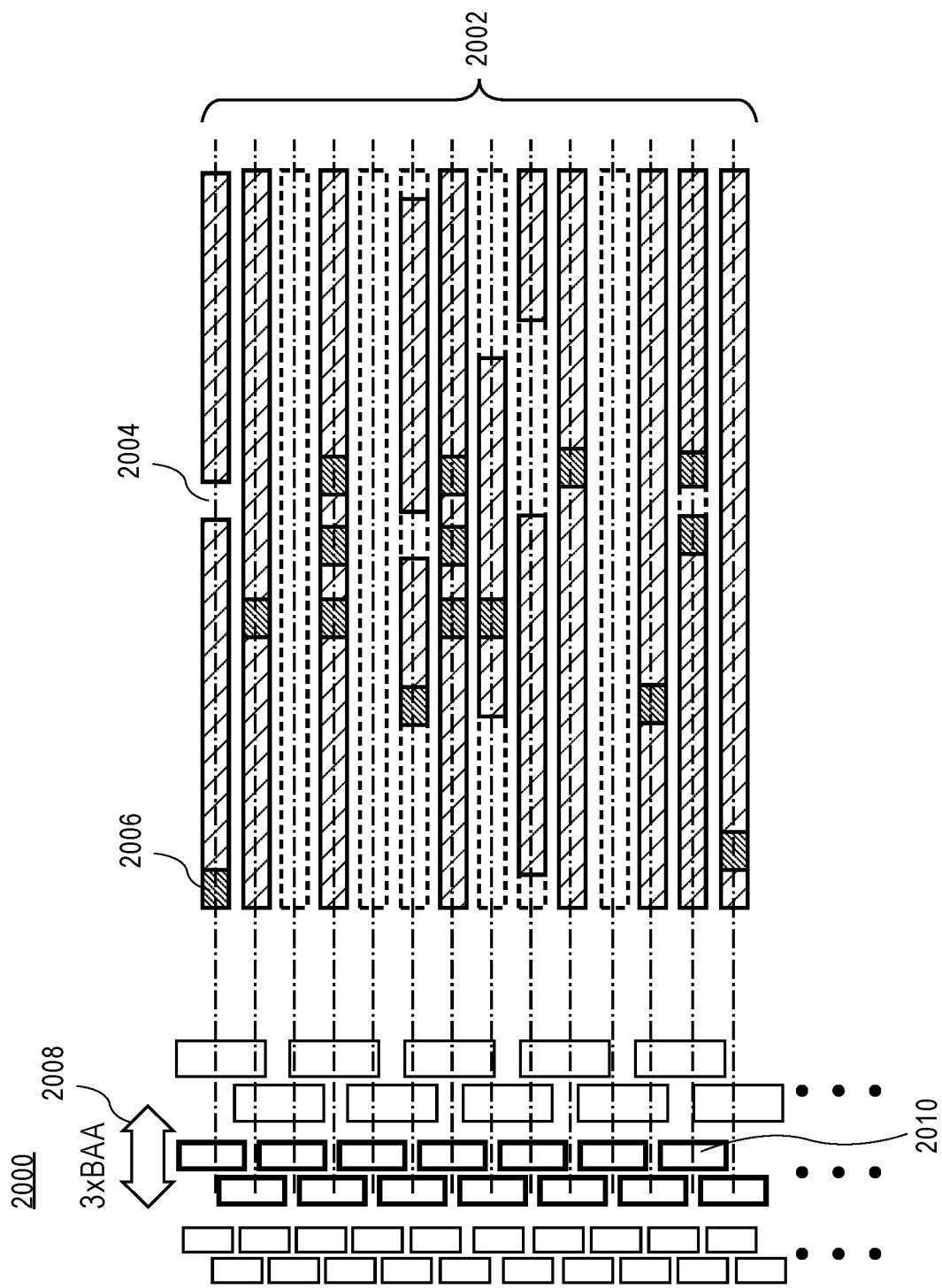
FIG. 20 illustrates a three beam staggered overlapping aperture array (left) of a BAA relative to a plurality of medium sized lines (right) having cuts (breaks in the horizontal lines) or vias (filled-in boxes) patterned using the BAA, with scanning direction shown by the arrow, in accordance with an embodiment of the present invention.

FIG. 20 illustrates a three beam staggered overlapping aperture array 2000 of a BAA relative to a plurality of medium sized lines 2002 having cuts (e.g., breaks 2004 in the horizontal lines) or vias (filled-in boxes 2006) patterned using the BAA, with scanning direction shown by the arrow 2008, in accordance with an embodiment of the present invention. Referring to FIG. 20, all the lines in a local region are of the same size (in this case, corresponding to the medium sized apertures 2010 in the middle of the BAA). Thus, FIG. 20 illustrates a typical pattern produced by one of three staggered beam aperture arrays. Dotted lines show where cuts occurred in patterned lines. Dark rectangles are patterning vias that land on top of the lines 2002. In this case, only the medium blanker array is enabled.

Figure 21:
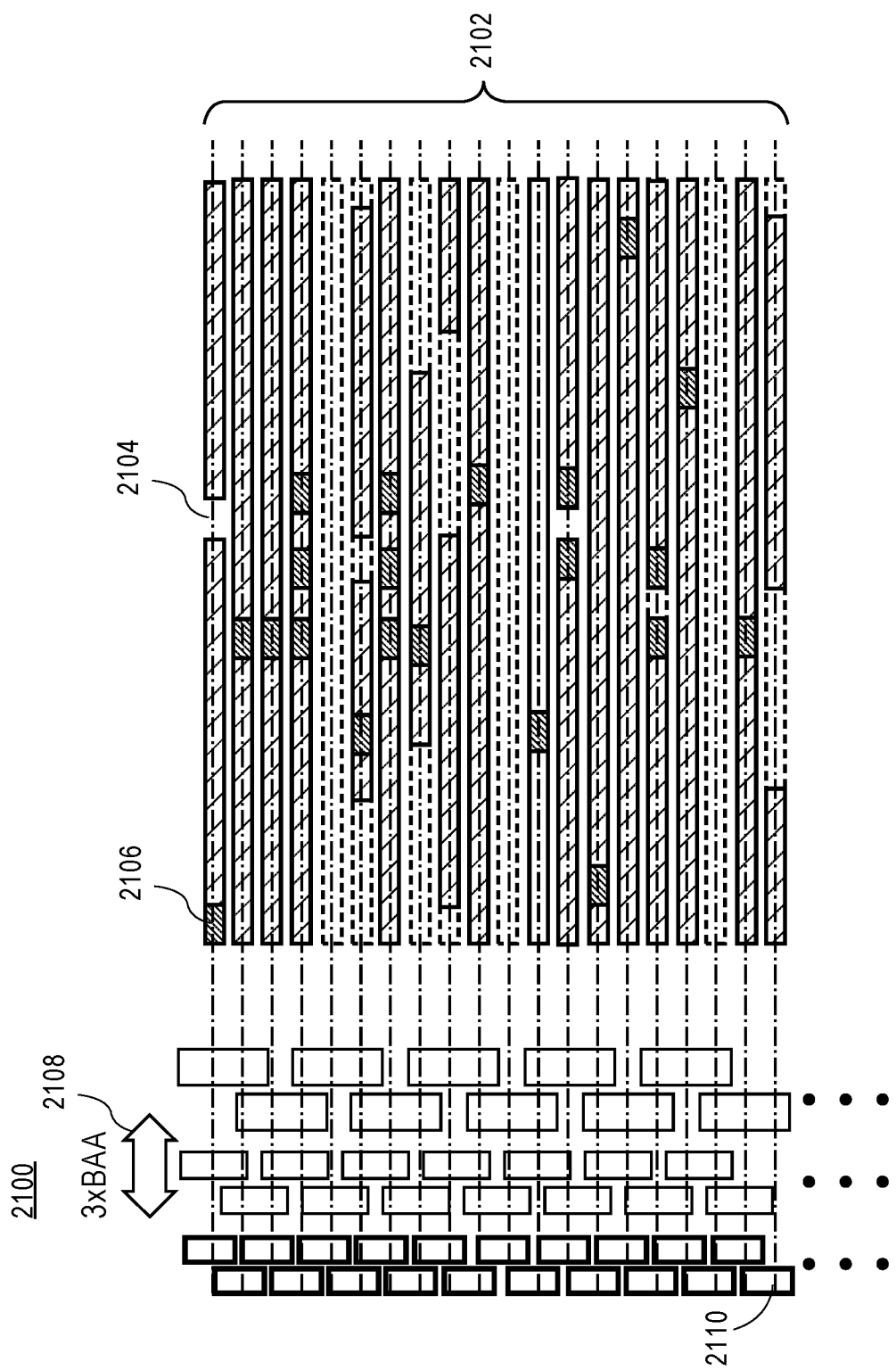
FIG. 21 illustrates a three beam staggered overlapping aperture array (left) of a BAA relative to a plurality of small lines (right) having cuts (breaks in the horizontal lines) or vias (filled-in boxes) patterned using the BAA, with scanning direction shown by the arrow, in accordance with an embodiment of the present invention.

FIG. 21 illustrates a three beam staggered overlapping aperture array 2100 of a BAA relative to a plurality of small lines 2102 having cuts (e.g., breaks 2104 in the horizontal lines) or vias (filled-in boxes 2106) patterned using the BAA, with scanning direction shown by the arrow 2108, in accordance with an embodiment of the present invention. Referring to FIG. 21, all the lines in a local region are of the same size (in this case, corresponding to the smallest apertures 2110 on the left side of the BAA). Thus, FIG. 21 illustrates a typical pattern produced by one of three staggered beam aperture arrays. Dotted lines show where cuts occurred in patterned lines. Dark rectangles are patterning vias that land on top of the lines 2102. In this case, only the small blanker array is enabled.

Figure 22A:
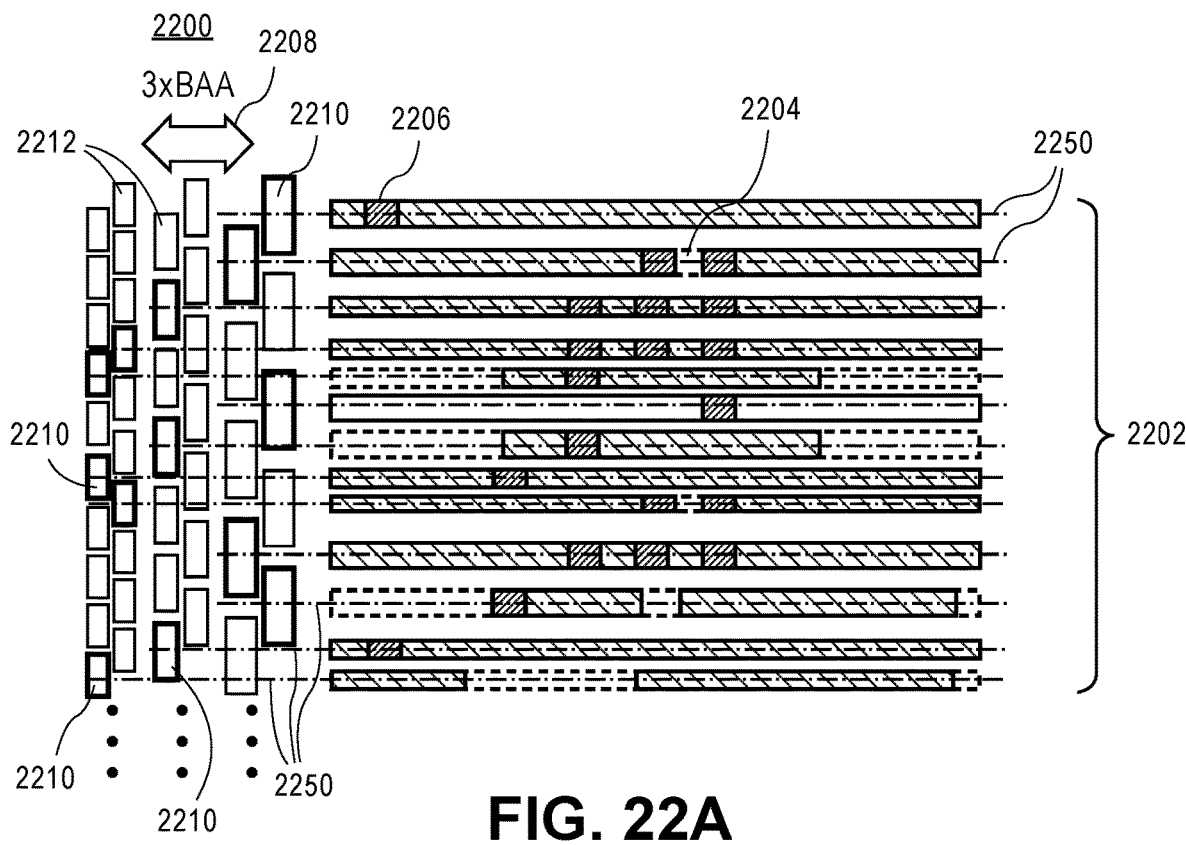
FIG. 22A illustrates a three beam staggered overlapping aperture array (left) of a BAA relative to a plurality of lines of varying size (right) having cuts (breaks in the horizontal lines) or vias (filled-in boxes) patterned using the BAA, with scanning direction shown by the arrow, in accordance with an embodiment of the present invention.

In another embodiment, combinations of the three pitches can be patterned, where the aperture alignment is possible against the lines already in these positions. FIG. 22A illustrates a three beam staggered overlapping aperture array 2200 of a BAA relative to a plurality of lines 2202 of varying size having cuts (e.g., breaks 2204 in the horizontal lines) or vias (filled-in boxes 2206) patterned using the BAA, with scanning direction shown by the arrow 2208, in accordance with an embodiment of the present invention. Referring to FIG. 22A, as many as three different metal widths can be patterned on the fixed grids 2250 that occur on the three-staggered BAA. The dark colored apertures 2210 of the BAA are being turned on/off during they scan. The light colored BAA apertures 2212 remain off. Thus, FIG. 22A illustrates a typical pattern produced by simultaneous use of all three staggered beam aperture arrays. Dotted lines show where cuts occurred in patterned lines. Dark rectangles are patterning vias that land on top of the lines 2202. In this case, the small blanker array, the medium blanker array and the large blanker array are all enabled.

Figure 22B:
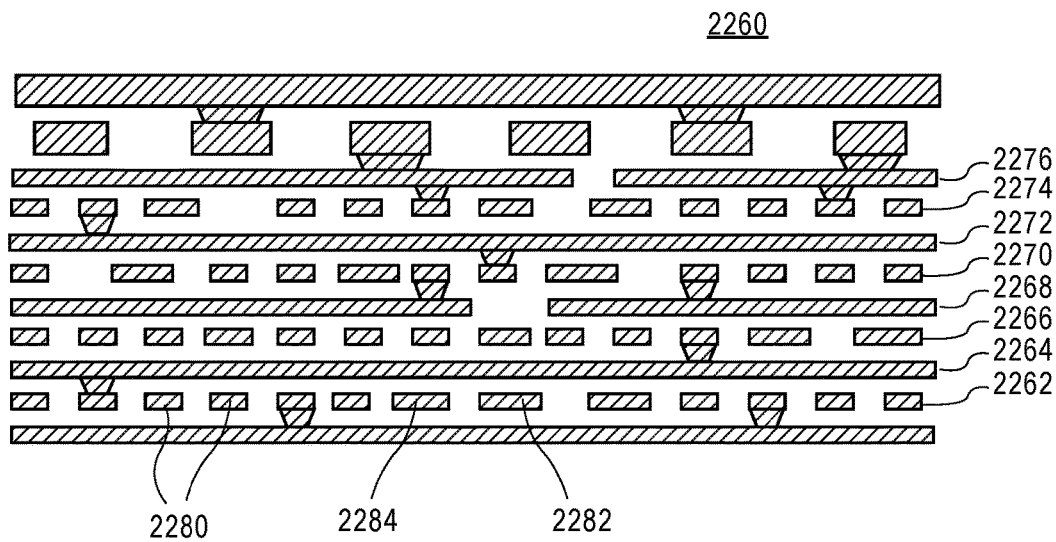
FIG. 22B illustrates a cross-sectional view of a stack of metallization layers in an integrated circuit based on metal line layouts of the type illustrated in FIG. 22A, in accordance with an embodiment of the present invention.

FIG. 22B illustrates a cross-sectional view of a stack 2260 of metallization layers in an integrated circuit based on metal line layouts of the type illustrated in FIG. 22A, in accordance with an embodiment of the present invention. Referring to FIG. 22B, in an exemplary embodiment, a metal cross-section for an interconnect stack is derived from three BAA pitch arrays of 1×, 1.5× and 3× pitch/width for the lower eight matched levels 2262, 2264, 2266, 2268, 2270, 2272, 2274 and 2276. For example, in level 2262, exemplary lines 2280 of 1×, an exemplary line 2282 of 1.5×, and an exemplary line 2284 of 3× are called out. It is to be appreciated that the varying width for the metals can only be seen for those layers with lines coming out of the page. All metals in the same layer are the same thickness regardless of metal width. It is to be appreciated that upper thicker/wider metals would not be made with the same three pitch BAA.

Figure 23:
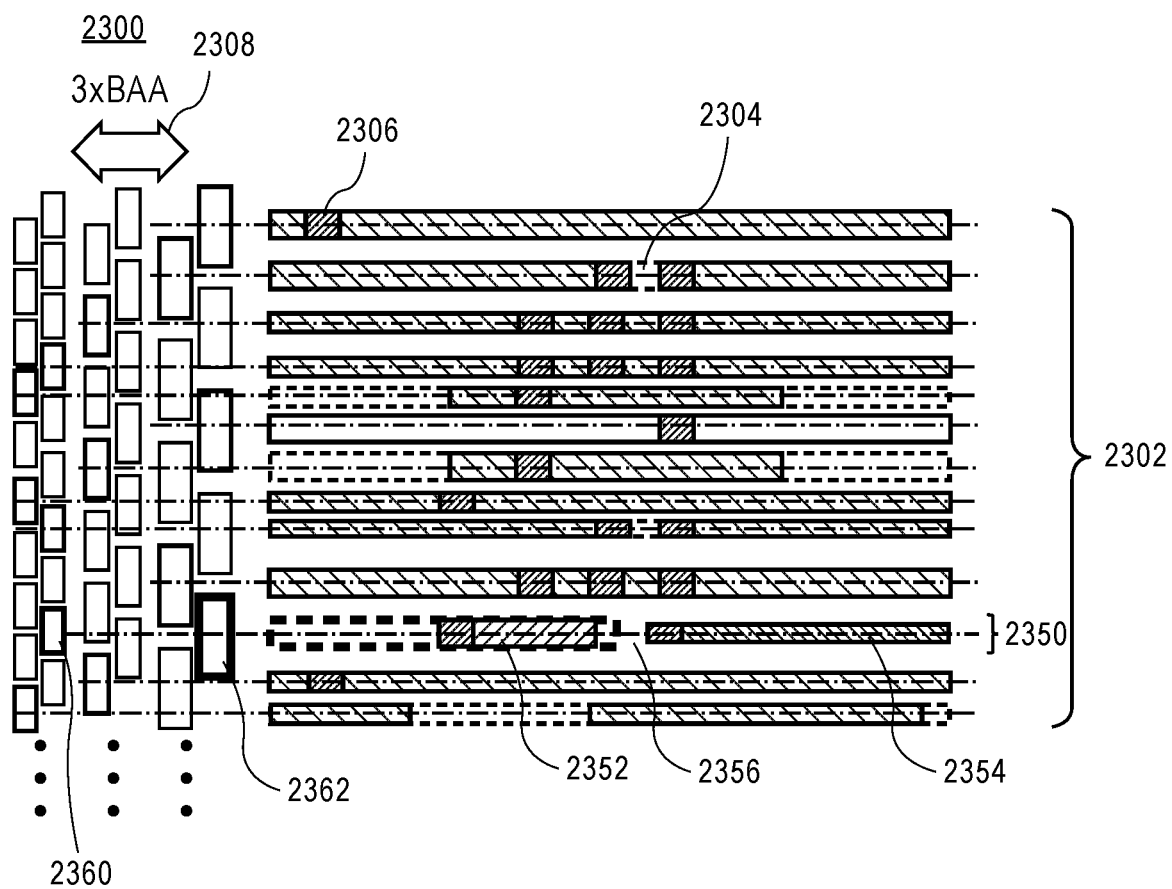
FIG. 23 illustrates a three beam staggered overlapping aperture array (left) of a BAA relative to a plurality of lines of varying size (right) having cuts (breaks in the horizontal lines) or vias (filled-in boxes) patterned using the BAA, with scanning direction shown by the arrow, in accordance with an embodiment of the present invention.

In another embodiment, different lines within the array can change width. FIG. 23 illustrates a three beam staggered overlapping aperture array 2300 of a BAA relative to a plurality of lines 2302 of varying size having cuts (e.g., breaks 2304 in the horizontal lines) or vias (filled-in boxes 2306) patterned using the BAA, with scanning direction shown by the arrow 2308, in accordance with an embodiment of the present invention. Referring to FIG. 23, the third horizontal line 2350 from the bottom of the array of lines 2302 has a wide line 2352 on a same grid line 2356 as a narrow line 2354. The corresponding different sized, but horizontally aligned, apertures 2360 and 2362 used to cut or make vias in the different sized lines are highlighted and horizontally centered with the two lines 2352 and 2354. Thus, FIG. 23 illustrates a scenario with the additional possibility to change line widths during patterning, as well as within different regions.

Figure 24:
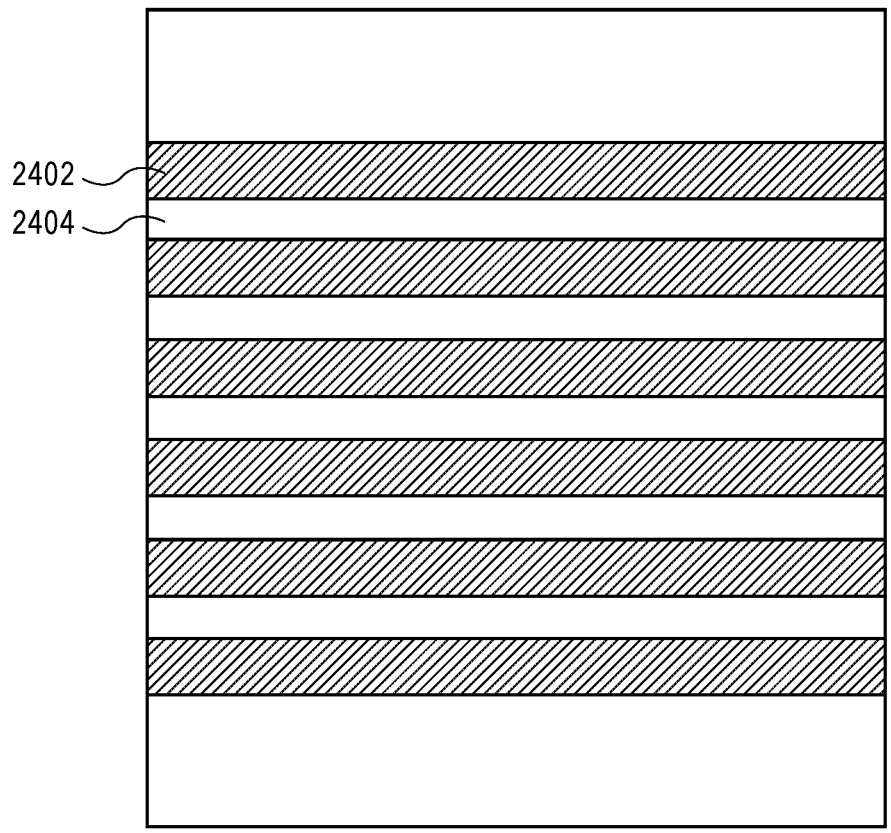
FIG. 24 illustrates a plan view and corresponding cross-sectional view of a previous layer metallization structure, in accordance with an embodiment of the present invention.
Figure 24:
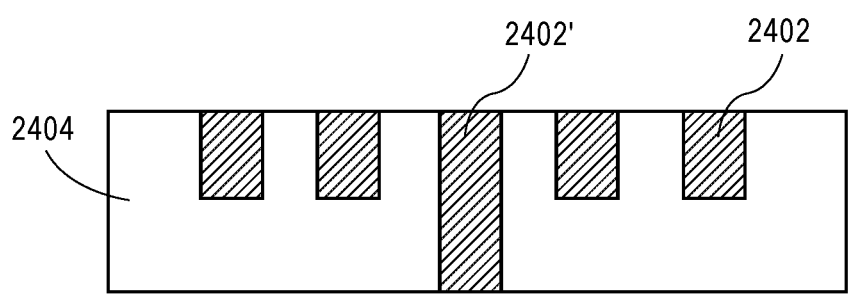

More generally, referring to all of the above aspects of embodiments of the present invention, it is to be appreciated that a metallization layer having lines with line cuts (or plugs) and having associated vias may be fabricated above a substrate and, in one embodiment, may be fabricated above a previous metallization layer. As an example, FIG. 24 illustrates a plan view and corresponding cross-sectional view of a previous layer metallization structure, in accordance with an embodiment of the present invention. Referring to FIG. 24, a starting structure 2400 includes a pattern of metal lines 2402 and interlayer dielectric (ILD) lines 2404. The starting structure 2400 may be patterned in a grating-like pattern with metal lines spaced at a constant pitch and having a constant width, as is depicted in FIG. 24. Although not shown, the lines 2402 may have interruptions (i.e., cuts or plugs) at various locations along the lines. The pattern, for example, may be fabricated by a pitch halving or pitch quartering approach, as described above. Some of the lines may be associated with underlying vias, such as line 2402' shown as an example in the cross-sectional view.

In an embodiment, fabrication of a metallization layer on the previous metallization structure of FIG. 24 begins with formation of an interlayer dielectric (ILD) material above the structure 2400. A hardmask material layer may then be formed on the ILD layer. The hardmask material layer may be patterned to form a grating of unidirectional lines orthogonal to the lines 2402 of 2400. In one embodiment, the grating of unidirectional hardmask lines is fabricated using conventional lithography (e.g., photoresist and other associated layers) and may have a line density defined by a pitch-halving, pitch-quartering etc. approach as described above. The grating of hardmask lines leaves exposed a grating region of the underlying ILD layer. It is these exposed portions of the ILD layer that are ultimately patterned for metal line formation, via formation, and plug formation. For example, in an embodiment, via locations are patterned in regions of the exposed ILD using EBL as described above. The patterning may involve formation of a resist layer and patterning of the resist layer by EBL to provide via opening locations which may be etched into the ILD regions. The lines of overlying hardmask can be used to confine the vias to only regions of the exposed ILD, with overlap accommodated by the hardmask lines which can effectively be used as an etch stop. Plug (or cut) locations may also be patterned in exposed regions of the ILD, as confined by the overlying hardmask lines, in a separate EBL processing operation. The fabrication of cuts or plugs effectively preserve regions of ILD that will ultimately interrupt metal lines fabricated therein. Metal lines may then be fabricated using a damascene approach, where exposed portions of the ILD (those portions between the hardmask lines and not protected by a plug preservation layer, such as a resist layer patterned during "cutting") are partially recessed. The recessing may further extend the via locations to open metal lines from the underlying metallization structure. The partially recessed ILD regions are then filled with metal (a process which may also involve filling the via locations), e.g., by plating and CMP processing, to provide metal lines between the overlying hardmask lines. The hardmask lines may ultimately be removed for completion of a metallization structure. It is to be appreciated that the above ordering of line cuts, via formation, and ultimate line formation is provided only as an example. A variety of processing schemes may be accommodated using EBL cuts and vias, as described herein.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 24 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 35 may be fabricated on underlying lower level interconnect layers.

In another embodiment, EBL cuts may be used to fabricate semiconductor devices, such as PMOS or NMOS devices of an integrated circuit. In one such embodiment, EBL cuts are used to pattern a grating of active regions that are ultimately used to form fin-based or trigate structures. In another such embodiment, EBL cuts are used to pattern a gate layer, such as a poly layer, ultimately used for gate electrode fabrication. As an example of a completed device, FIGS. 25A and 25B illustrate a cross-sectional view and a plan view (taken along the a-a' axis of the cross-sectional view), respectively, of a non-planar semiconductor device having a plurality of fins, in accordance with an embodiment of the present invention.

Figure 25A:
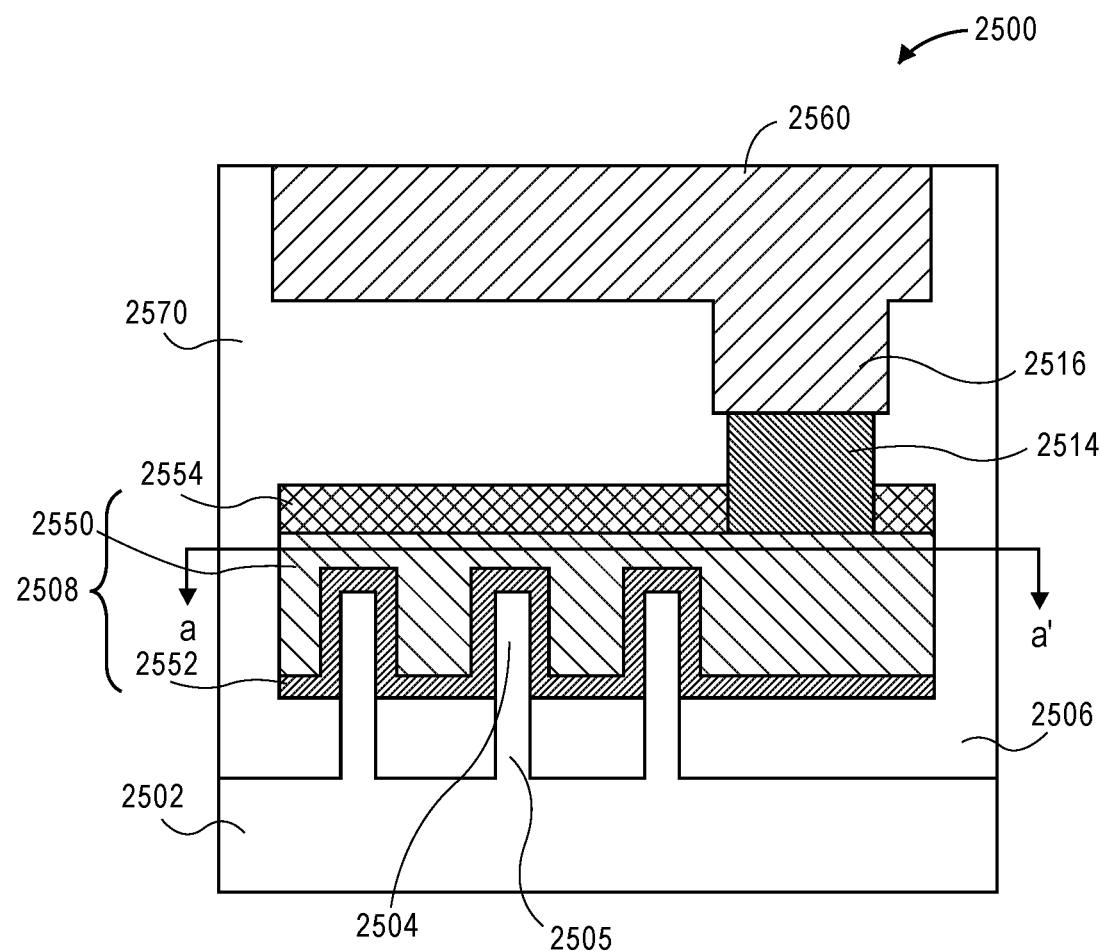
FIG. 25A illustrates a cross-sectional view of a non-planar semiconductor device having fins, in accordance with an embodiment of the present invention.

Referring to FIG. 25A, a semiconductor structure or device 2500 includes a non-planar active region (e.g., a fin structure including protruding fin portion 2504 and sub-fin region 2505) formed from substrate 2502, and within isolation region 2506: A gate line 2508 is disposed over the protruding portions 2504 of the non-planar active region as well as over a portion of the isolation region 2506. As shown, gate line 2508 includes a gate electrode 2550 and a gate dielectric layer 2552. In one embodiment, gate line 2508 may also include a dielectric cap layer 2554. A gate contact 2514, and overlying gate contact via 2516 are also seen from this perspective, along with an overlying metal interconnect 2560, all of which are disposed in inter-layer dielectric stacks or layers 2570. Also seen from the perspective of FIG. 25A, the gate contact 2514 is, in one embodiment, disposed over isolation region 2506, but not over the non-planar active regions.

Figure 25B:
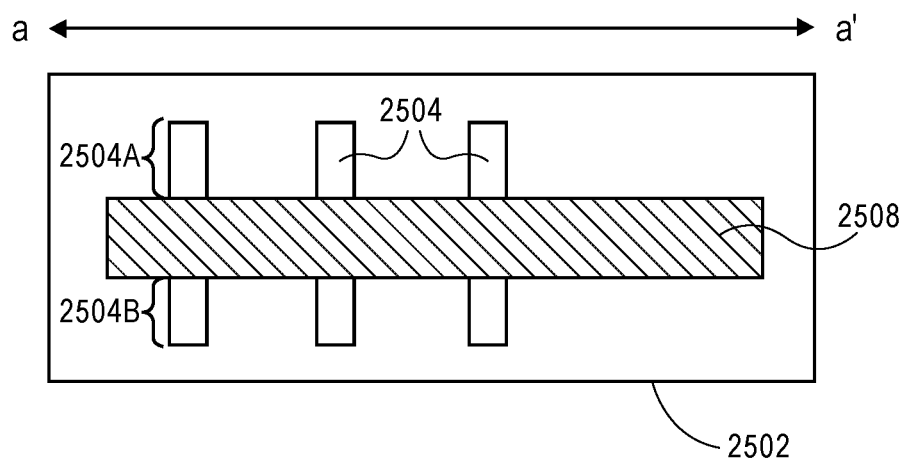
FIG. 25B illustrates a plan view taken along the a-a' axis of the semiconductor device of FIG. 25A, in accordance with an embodiment of the present invention.

Referring to FIG. 25B, the gate line 2508 is shown as disposed over the protruding fin portions 2504. Source and drain regions 2504A and 2504B of the protruding fin portions 2504 can be seen from this perspective. In one embodiment, the source and drain regions 2504A and 2504B are doped portions of original material of the protruding fin portions 2504. In another embodiment, the material of the protruding fin portions 2504 is removed and replaced with another semiconductor material, e.g., by epitaxial deposition. In either case, the source and drain regions 2504A and 2504B may extend below the height of dielectric layer 2506, i.e., into the sub-fin region 2505.

In an embodiment, the semiconductor structure or device 2500 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 2508 surround at least a top surface and a pair of sidewalls of the three-dimensional body.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 26:
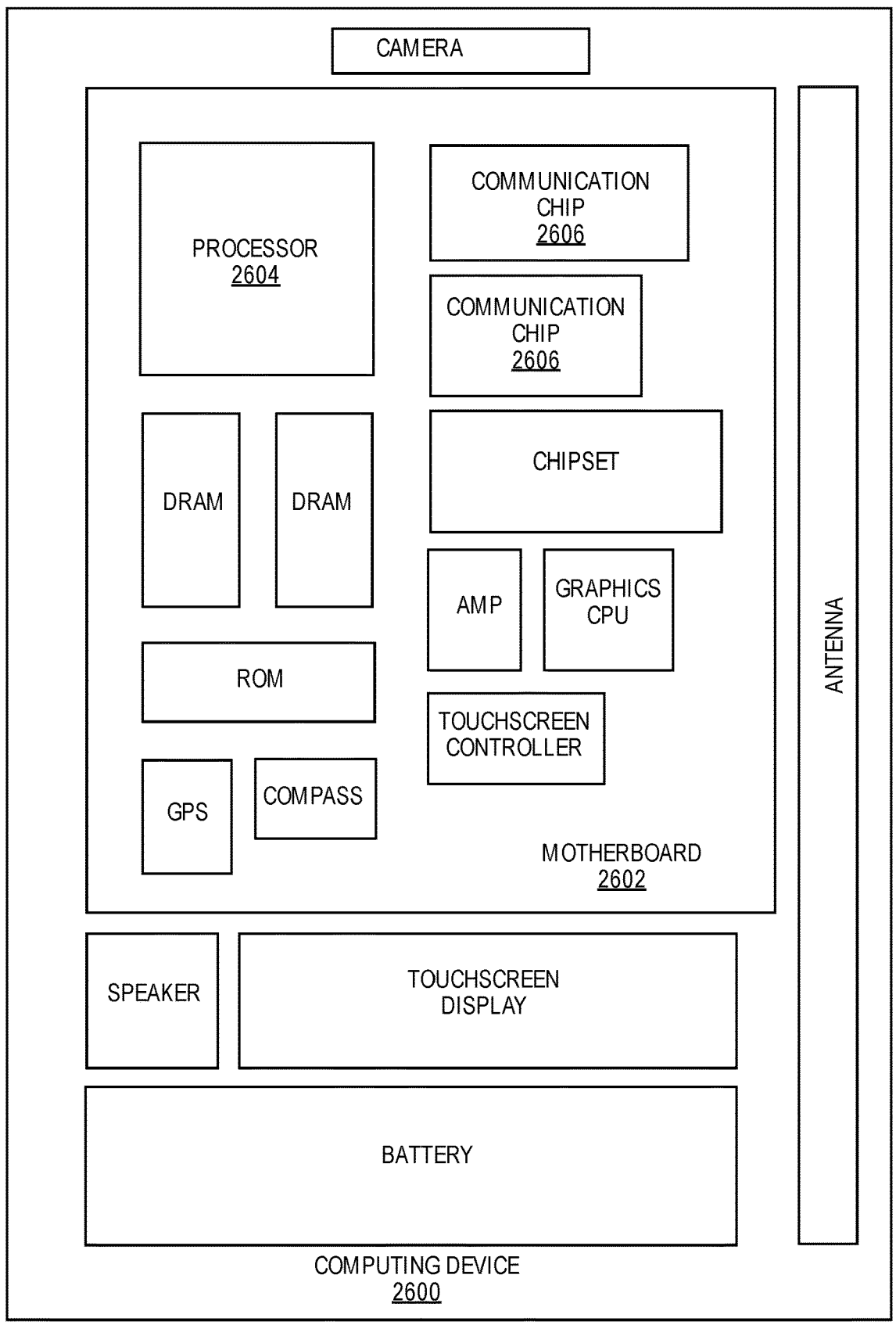
FIG. 26 illustrates a computing device in accordance with one implementation of the invention.

FIG. 26 illustrates a computing device 2600 in accordance with one implementation of the invention. The computing device 2600 houses a board 2602. The board 2602 may include a number of components, including but not limited to a processor 2604 and at least one communication chip 2606. The processor 2604 is physically and electrically coupled to the board 2602. In some implementations the at least one communication chip 2606 is also physically and electrically coupled to the board 2602. In further implementations, the communication chip 2606 is part of the processor 2604.

Depending on its applications, computing device 2600 may include other components that may or may not be physically and electrically coupled to the board 2602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2606 enables wireless communications for the transfer of data to and from the computing device 2600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2600 may include a plurality of communication chips 2606. For instance, a first communication chip 2606 may be dedicated to shorter range wireless communications such as Wi-Fi and Bluetooth and a second communication chip 2606 may be dedicated to longer range wireless communications such as GPS, EDGE, GPRS, CDMA, WiMAX, LTE, Ev-DO, and others.

The processor 2604 of the computing device 2600 includes an integrated circuit die packaged within the processor 2604. In some implementations of the invention, the integrated circuit die of the processor includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 2606 also includes an integrated circuit die packaged within the communication chip 2606. In accordance with another implementation of embodiments of the invention, the integrated circuit die of the communication chip includes one or more structures fabricated using CEBL, in accordance with implementations of embodiments of the invention.

In further implementations, another component housed within the computing device 2600 may contain an integrated circuit die that includes one or more structures fabricated using CEBL, in accordance with implementations of embodiments of the invention.

In various implementations, the computing device 2600 may be a laptop, a netbook, a notebook, an Ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2600 may be any other electronic device that processes data.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with an ebeam tool such as described in association with FIG. 4 and/or FIGS. 15-17. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 27:
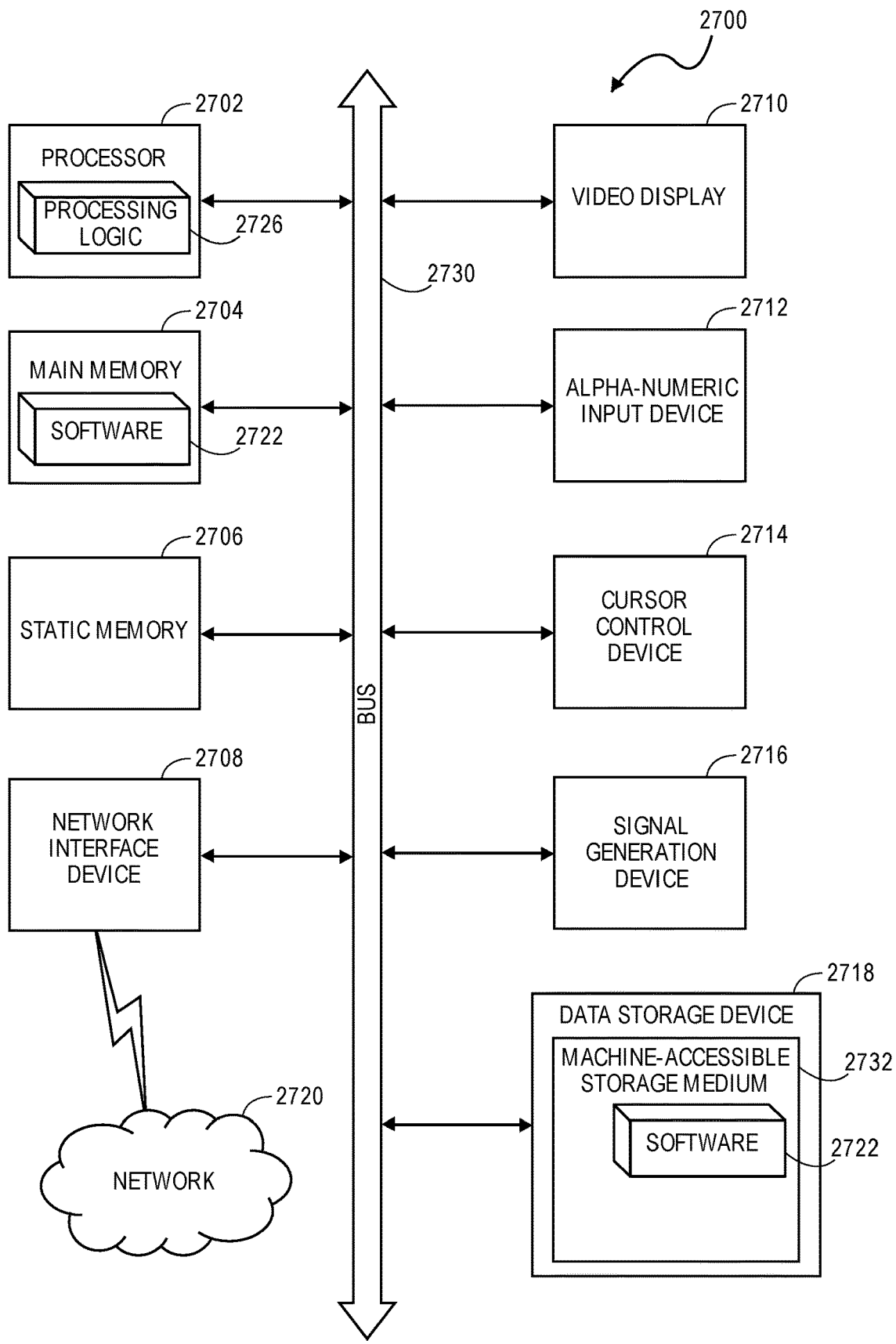
FIG. 27 illustrates a block diagram of an exemplary computer system, in accordance with an embodiment of the present invention.

FIG. 27 illustrates a diagrammatic representation of a machine in the exemplary form of a computer system 2700 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 2700 includes a processor 2702, a main memory 2704 (e.g., read-only memory (ROM), flash memory, dynamic random access memory (DRAM) such as synchronous DRAM (SDRAM) or Rambus DRAM (RDRAM), etc.), a static memory 2706 (e.g., flash memory, static random access memory (SRAM), etc.), and a secondary memory 2718 (e.g., a data storage device), which communicate with each other via a bus 2730.

Processor 2702 represents one or more general-purpose processing devices such as a microprocessor, central processing unit, or the like. More particularly, the processor 2702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 2702 may also be one or more special-purpose processing devices such as an application specific integrated circuit (ASIC), a field programmable gate array (FPGA), a digital signal processor (DSP), network processor, or the like. Processor 2702 is configured to execute the processing logic 2726 for performing the operations described herein.

The computer system 2700 may further include a network interface device 2708. The computer system 2700 also may include a video display unit 2710 (e.g., a liquid crystal display (LCD), a light emitting diode display (LED), or a cathode ray tube (CRT)), an alphanumeric input device 2712 (e.g., a keyboard), a cursor control device 2714 (e.g., a mouse), and a signal generation device 2716 (e.g., a speaker).

The secondary memory 2718 may include a machine-accessible storage medium (or more specifically a computer-readable storage medium) 2732 on which is stored one or more sets of instructions (e.g., software 2722) embodying any one or more of the methodologies or functions described herein. The software 2722 may also reside, completely or at least partially, within the main memory 2704 and/or within the processor 2702 during execution thereof by the computer system 2700, the main memory 2704 and the processor 2702 also constituting machine-readable storage media. The software 2722 may further be transmitted or received over a network 2720 via the network interface device 2708.

While the machine-accessible storage medium 2732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 28:
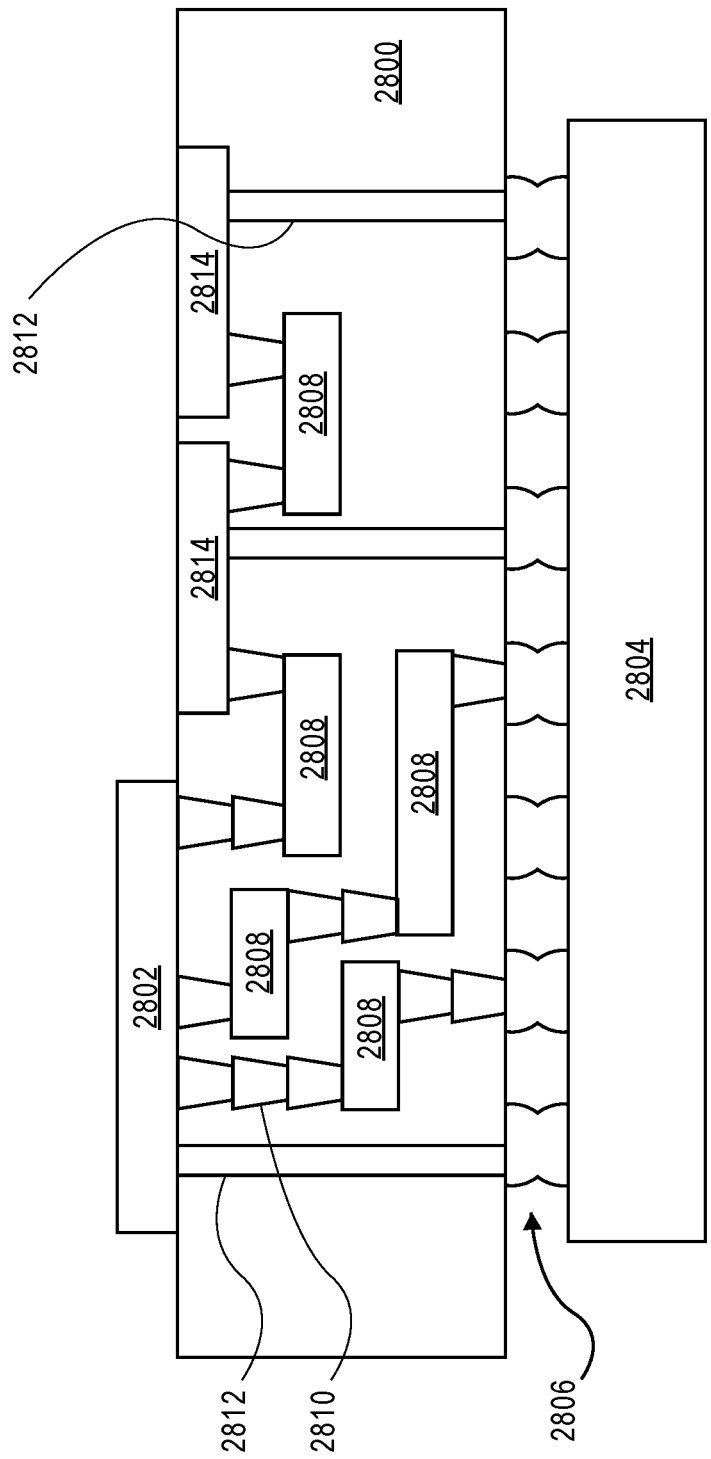
FIG. 28 is an interposer implementing one or more embodiments of the invention.

FIG. 28 illustrates an interposer 2800 that includes one or more embodiments of the invention. The interposer 2800 is an intervening substrate used to bridge a first substrate 2802 to a second substrate 2804. The first substrate 2802 may be, for instance, an integrated circuit die. The second substrate 2804 may be, for instance, a memory module, a computer motherboard, or another integrated circuit die. Generally, the purpose of an interposer 2800 is to spread a connection to a wider pitch or to reroute a connection to a different connection. For example, an interposer 2800 may couple an integrated circuit die to a ball grid array (BGA) 2806 that can subsequently be coupled to the second substrate 2804. In some embodiments, the first and second substrates 2802/2804 are attached to opposing sides of the interposer 2800. In other embodiments, the first and second substrates 2802/2804 are attached to the same side of the interposer 2800. And in further embodiments, three or more substrates are interconnected by way of the interposer 2800.

The interposer 2800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 2808 and vias 2810, including but not limited to through-silicon vias (TSVs) 2812. The interposer 2800 may further include embedded devices 2814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 2800.

In accordance with embodiments of the invention, apparatuses or processes disclosed herein may be used in the fabrication of interposer 2800.

Figure 29:
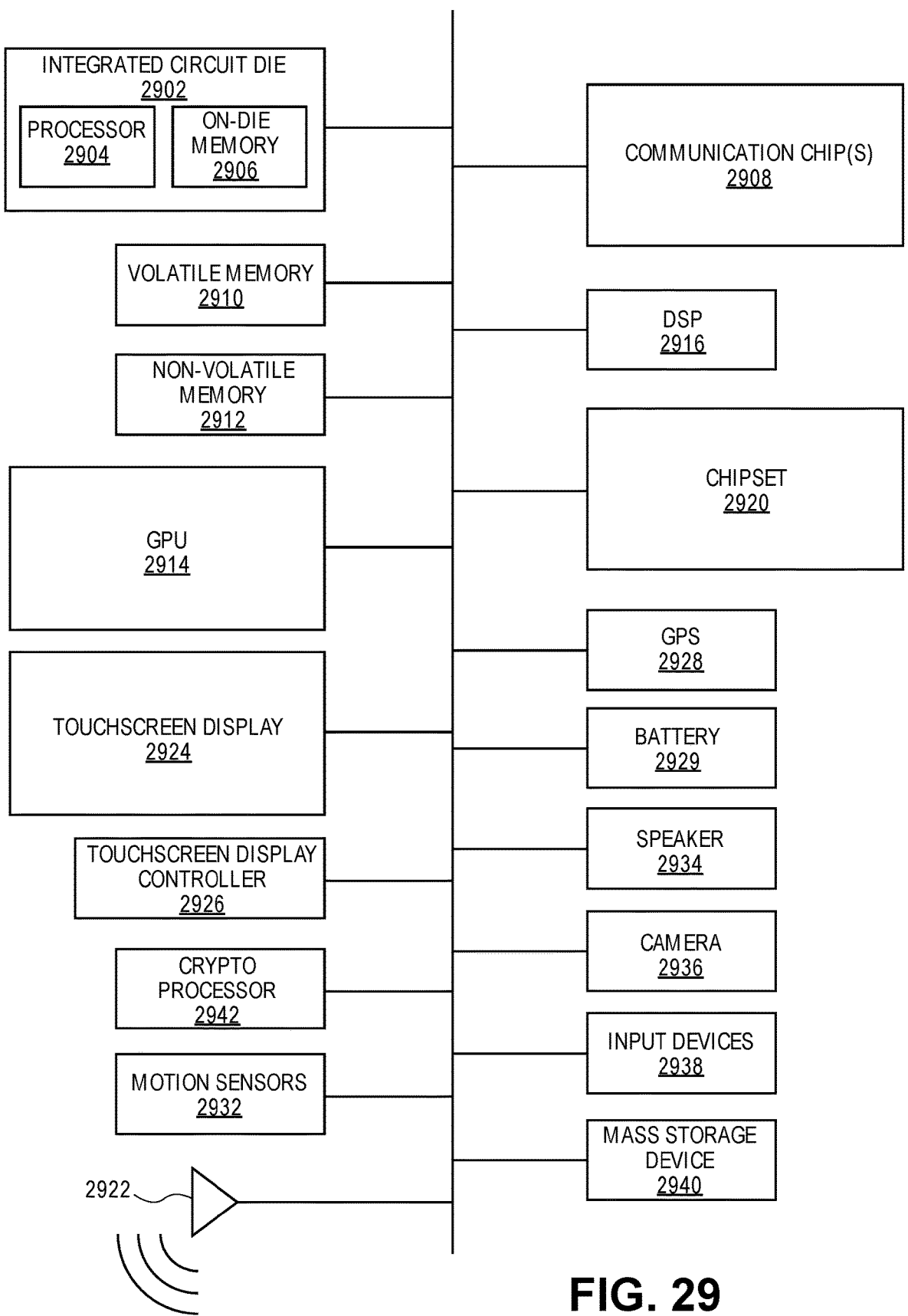
FIG. 29 is a computing device built in accordance with an embodiment of the invention.

FIG. 29 illustrates a computing device 2900 in accordance with one embodiment of the invention. The computing device 2900 may include a number of components. In one embodiment, these components are attached to one or more motherboards. In an alternate embodiment, these components are fabricated onto a single system-on-a-chip (SoC) die rather than a motherboard. The components in the computing device 2900 include, but are not limited to, an integrated circuit die 2902 and at least one communication chip 2908. In some implementations the communication chip 2908 is fabricated as part of the integrated circuit die 2902. The integrated circuit die 2902 may include a CPU 2904 as well as on-die memory 2906, often used as cache memory, that can be provided by technologies such as embedded DRAM (eDRAM) or spin-transfer torque memory (STTM or STTM-RAM).

Computing device 2900 may include other components that may or may not be physically and electrically coupled to the motherboard or fabricated within an SoC die. These other components include, but are not limited to, volatile memory 2910 (e.g., DRAM), non-volatile memory 2912 (e.g., ROM or flash memory), a graphics processing unit 2914 (GPU), a digital signal processor 2916, a crypto processor 2942 (a specialized processor that executes cryptographic algorithms within hardware), a chipset 2920, an antenna 2922, a display or a touchscreen display 2924, a touchscreen controller 2926, a battery 2929 or other power source, a power amplifier (not shown), a global positioning system (GPS) device 2928, a compass 2930, a motion coprocessor or sensors 2932 (that may include an accelerometer, a gyroscope, and a compass), a speaker 2934, a camera 2936, user input devices 2938 (such as a keyboard, mouse, stylus, and touchpad), and a mass storage device 2940 (such as hard disk drive, compact disk (CD), digital versatile disk (DVD), and so forth).

The communications chip 2908 enables wireless communications for the transfer of data to and from the computing device 2900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2900 may include a plurality of communication chips 2908. For instance, a first communication chip 2908 may be dedicated to shorter range wireless communications such as Wi-Fi and Bluetooth and a second communication chip 2908 may be dedicated to longer range wireless communications such as GPS, EDGE, GPRS, CDMA, WiMAX, LTE, Ev-DO, and others.

The processor 2904 of the computing device 2900 includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 2908 may also include one or more structures fabricated using CEBL, in accordance with implementations of embodiments of the invention.

In further embodiments, another component housed within the computing device 2900 may contain one or more structures fabricated using CEBL, in accordance with implementations of embodiments of the invention.

In various embodiments, the computing device 2900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2900 may be any other electronic device that processes data.

The above description of illustrated implementations of embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example embodiment 1: A method of forming a pattern for a semiconductor structure includes forming a pattern of parallel lines above a substrate. The method also includes aligning the substrate in an e-beam tool to provide the pattern of parallel lines parallel with a scan direction of the e-beam tool. The e-beam tool includes a column having a blanker aperture array (BAA) with a staggered pair of columns of openings along an array direction orthogonal to the scan direction. The method also includes forming a pattern of cuts or vias in or above the pattern of parallel lines to provide line breaks for the pattern of parallel lines by scanning the substrate along the scan direction. A cumulative current through the column has a non-zero and substantially uniform cumulative current value throughout the scanning.

Example embodiment 2: The method of example embodiment 1, wherein a variation in the cumulative current through the column is less than 50% of the cumulative current value throughout the scanning.

Example embodiment 3: The method of example embodiment 1 or 2, wherein the variation in the cumulative current through the column is less than 10% of the cumulative current value throughout the scanning.

Example embodiment 4: The method of example embodiment 1, 2 or 3, wherein the pattern of parallel lines has a pitch, and wherein each column of the staggered pair of columns of openings has a pitch corresponding to twice the pitch of the pattern of parallel lines.

Example embodiment 5: The method of example embodiment 1, 2, 3 or 4, wherein the staggered pair of columns of openings is a non-overlapping staggered pair of columns of openings.

Example embodiment 6: The method of example embodiment 1, 2, 3 or 4, wherein the staggered pair of columns of openings is an overlapping staggered pair of columns of openings.

Example embodiment 7: The method of example embodiment 1, 2, 3, 4, 5 or 6, wherein forming the pattern of parallel lines involves using a pitch halving or pitch quartering technique.

Example embodiment 8: The method of example embodiment 1, 2, 3, 4, 5, 6 or 7, wherein forming the pattern of cuts or vias involves exposing regions of a layer of photoresist material.

Example embodiment 9: The method of example embodiment 1, 2, 3, 4, 5, 6, 7 or 8, wherein the pitch of the pattern of parallel lines is twice the line width of each line.

Example embodiment 10: A method of forming a pattern for a semiconductor structure includes forming a pattern of parallel lines above a substrate. The method also includes aligning the substrate in an e-beam tool to provide the pattern of parallel lines parallel with a scan direction of the e-beam tool. The e-beam tool includes a column having a blanker aperture array (BAA) with a staggered pair of columns of openings along an array direction orthogonal to the scan direction. The method also includes forming a pattern of cuts or vias in or above the pattern of parallel lines to provide line breaks for the pattern of parallel lines by scanning the substrate along the scan direction. A sub resolution pattern is formed throughout the scanning.

Example embodiment 11: The method of example embodiment 10, wherein the pattern of cuts or vias is staggered from the sub resolution pattern along the scan direction.

Example embodiment 12: The method of example embodiment 10 or 11, wherein the pattern of cuts or vias is formed along a first line of the pattern of parallel lines, and wherein the sub resolution pattern is formed along a second line of the pattern of parallel lines, the second line directly adjacent to a first side of the first line.

Example embodiment 13: The method of example embodiment 12, wherein the sub resolution pattern is further formed along a third line of the pattern of parallel lines, the third line directly adjacent to a second side of the first line opposite the first side of the first line.

Example embodiment 14: The method of example embodiment 10, 11, 12 or 13, wherein the staggered pair of columns of openings is an overlapping staggered pair of columns of openings.

Example embodiment 15: The method of example embodiment 10, 11, 12, 13 or 14, wherein forming the pattern of parallel lines involves using a pitch halving or pitch quartering technique.

Example embodiment 16: The method of example embodiment 10, 11, 12, 13, 14 or 15, wherein forming the pattern of cuts or vias involves exposing regions of a layer of photoresist material.

Example embodiment 17: A method of forming a pattern for a semiconductor structure includes forming a pattern of parallel lines above a substrate. The method also includes aligning the substrate in an e-beam tool to provide the pattern of parallel lines parallel with a scan direction of the e-beam tool. The e-beam tool includes a column having a blanker aperture array (BAA) with a staggered pair of columns of openings along an array direction orthogonal to the scan direction. The method also includes forming a pattern of cuts or vias in or above the pattern of parallel lines to provide line breaks for the pattern of parallel lines by scanning the substrate along the scan direction. One or more dummy cuts or vias is formed throughout the scanning.

Example embodiment 18: The method of example embodiment 17, wherein the staggered pair of columns of openings is an overlapping staggered pair of columns of openings.

Example embodiment 19: The method of example embodiment 17 or 18, wherein forming the pattern of parallel lines involves using a pitch halving or pitch quartering technique.

Example embodiment 20: The method of example embodiment 17, 18 or 19, wherein forming the pattern of cuts or vias involves exposing regions of a layer of photoresist material.

Example embodiment 21: A column for an e-beam tool includes an electron source for providing a beam of electrons. A limiting aperture is coupled with the electron source along a pathway of the beam of electrons. High aspect ratio illumination optics are coupled with the limiting aperture along the pathway of the beam of electrons. A shaping aperture is coupled with the high aspect ratio illumination optics along the pathway of the beam of electrons. A blanker aperture array (BAA) is coupled with the shaping aperture along the pathway of the beam of electrons. The BAA includes a staggered pair of columns of openings along an array direction. The column also includes a final aperture coupled with the BAA along the pathway of the beam of electrons. A sample stage is included for receiving the beam of electrons. The sample stage has a scan direction orthogonal to the array direction of the BAA. The column is configured to provide a cumulative current through the column having a non-zero and substantially uniform cumulative current value during a scanning process performed along the scan direction.

Example embodiment 22: The column of example embodiment 21, wherein a variation in the cumulative current through the column is less than 50% of the cumulative current value during the scanning process.

Example embodiment 23: The column of example embodiment 21 or 22, wherein the variation in the cumulative current through the column is less than 10% of the cumulative current value during the scanning process.

Example embodiment 24: The column of example embodiment 21, 22 or 23, wherein the column is configured to form a sub resolution pattern during the scanning process.

Example embodiment 25: The column of example embodiment 21, 22, 23 or 24, wherein the column is configured to form one or more dummy features is during the scanning process.

What is claimed is:

1. A method of forming a pattern for a semiconductor structure, the method comprising:
    forming a pattern of parallel lines above a substrate;
    aligning the substrate in an e-beam tool to provide the pattern of parallel lines parallel with a scan direction of the e-beam tool, wherein the e-beam tool comprises a column having a blanker aperture array (BAA) comprising a staggered pair of columns of openings along an array direction orthogonal to the scan direction; and
    forming a pattern of cuts or vias in or above the pattern of parallel lines to provide line breaks for the pattern of parallel lines by scanning the substrate along the scan direction, wherein a cumulative current through the column has a non-zero and substantially uniform cumulative current value throughout the scanning.

2. The method of claim 1, wherein a variation in the cumulative current through the column is less than 50% of the cumulative current value throughout the scanning.

3. The method of claim 2, wherein the variation in the cumulative current through the column is less than 10% of the cumulative current value throughout the scanning.

4. The method of claim 1, wherein the pattern of parallel lines has a pitch, and wherein each column of the staggered pair of columns of openings has a pitch corresponding to twice the pitch of the pattern of parallel lines.

5. The method of claim 1, wherein the staggered pair of columns of openings is a non-overlapping staggered pair of columns of openings.

6. The method of claim 1, wherein the staggered pair of columns of openings is an overlapping staggered pair of columns of openings.

7. The method of claim 1, wherein forming the pattern of parallel lines comprises using a pitch halving or pitch quartering technique.

8. The method of claim 1, wherein forming the pattern of cuts or vias comprises exposing regions of a layer of photoresist material.

9. The method of claim 1, wherein the pitch of the pattern of parallel lines is twice the line width of each line.

10. A method of forming a pattern for a semiconductor structure, the method comprising:
    forming a pattern of parallel lines above a substrate;
    aligning the substrate in an e-beam tool to provide the pattern of parallel lines parallel with a scan direction of the e-beam tool, wherein the e-beam tool comprises a column having a blanker aperture array (BAA) comprising a staggered pair of columns of openings along an array direction orthogonal to the scan direction; and
    forming a pattern of cuts or vias in or above the pattern of parallel lines to provide line breaks for the pattern of parallel lines by scanning the substrate along the scan direction, wherein a sub resolution pattern is formed throughout the scanning.

11. The method of claim 10, wherein the pattern of cuts or vias is staggered from the sub resolution pattern along the scan direction.

12. The method of claim 10, wherein the pattern of cuts or vias is formed along a first line of the pattern of parallel lines, and wherein the sub resolution pattern is formed along a second line of the pattern of parallel lines, the second line directly adjacent to a first side of the first line.

13. The method of claim 12, wherein the sub resolution pattern is further formed along a third line of the pattern of parallel lines, the third line directly adjacent to a second side of the first line opposite the first side of the first line.

14. The method of claim 10, wherein the staggered pair of columns of openings is an overlapping staggered pair of columns of openings.

15. The method of claim 10, wherein forming the pattern of parallel lines comprises using a pitch halving or pitch quartering technique.

16. The method of claim 10, wherein forming the pattern of cuts or vias comprises exposing regions of a layer of photoresist material.

17. A method of forming a pattern for a semiconductor structure, the method comprising:
    forming a pattern of parallel lines above a substrate;
    aligning the substrate in an e-beam tool to provide the pattern of parallel lines parallel with a scan direction of the e-beam tool, wherein the e-beam tool comprises a column having a blanker aperture array (BAA) comprising a staggered pair of columns of openings along an array direction orthogonal to the scan direction; and
    forming a pattern of cuts or vias in or above the pattern of parallel lines to provide line breaks for the pattern of parallel lines by scanning the substrate along the scan direction, wherein one or more dummy cuts or vias is formed throughout the scanning.

18. The method of claim 17, wherein the staggered pair of columns of openings is an overlapping staggered pair of columns of openings.

19. The method of claim 17, wherein forming the pattern of parallel lines comprises using a pitch halving or pitch quartering technique.

20. The method of claim 17, wherein forming the pattern of cuts or vias comprises exposing regions of a layer of photoresist material.

* * * * *